United States Patent
Larson et al.

(10) Patent No.: US 7,944,287 B2
(45) Date of Patent: May 17, 2011

(54) LOW-NOISE, WIDE OFFSET RANGE, PROGRAMMABLE INPUT OFFSET AMPLIFIER FRONT END AND METHOD

(75) Inventors: Tony R. Larson, Tucson, AZ (US); Dimitar T. Trifonov, Vail, AZ (US); Jerry L. Doorenbos, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 164 days.

(21) Appl. No.: 12/229,278

(22) Filed: Aug. 21, 2008

(65) Prior Publication Data

US 2010/0019842 A1 Jan. 28, 2010

Related U.S. Application Data

(60) Provisional application No. 61/083,220, filed on Jul. 24, 2008.

(51) Int. Cl.
*H03F 1/02* (2006.01)
(52) U.S. Cl. ............... 330/9; 330/254; 330/283
(58) Field of Classification Search .............. 330/9, 278, 330/283, 253, 257; 327/307, 124, 554
See application file for complete search history.

(56) References Cited

U.S. PATENT DOCUMENTS 7,443,237 B1 * 10/2008 Liu .............................. 330/253
7,592,869 B2 * 9/2009 Bae et al. ..................... 330/254

* cited by examiner

*Primary Examiner* — Hieu P Nguyen
(74) *Attorney, Agent, or Firm* — John J. Patti; Wade J. Brady, III; Frederick J. Telecky, Jr

(57) ABSTRACT

A programmable offset amplifier includes first (M1) and second (M2) input transistors having differentially connected sources and gates coupled to first ($Vin^+$) and second ($Vin^-$) input voltages. A tail current ($I_{tail}$) is shared between the first and second input transistors. First (M3) and second (M4) load devices are coupled between a reference voltage and drains of the first and second input transistors, respectively. An output stage (13) has a first input (+) coupled to the drain of the second input transistor and a second input (−) coupled to the drain of the first input transistor. Programmable voltage changes are produced on input elements of programmable input offset circuitry to cause changes in offset voltages associated with electrodes of the input transistors which are reflected back to the amplifier input to provide a large programmable input-referred offset voltage.

24 Claims, 9 Drawing Sheets

LOW-NOISE, WIDE OFFSET RANGE, PROGRAMMABLE INPUT OFFSET AMPLIFIER FRONT END AND METHOD

CROSS REFERENCE TO RELATED APPLICATION

This application claims the benefit of prior filed U.S. provisional application Ser. No. 61/083,220 filed Jul. 24, 2008, entitled "A HIGH PERFORMANCE, LOW NOISE, WIDE OFFSET RANGE, PROGRAMMABLE INPUT OFFSET AMPLIFIER FRONT END", by Tony Ray Larson, Dimitar Trifonov, and Jerry L. Doorenbos, and incorporated herein by reference.

BACKGROUND OF THE INVENTION

This invention relates to programmable input offset gain amplifiers, and more particularly to circuitry which provides a substantially improved input offset voltage canceling range and which also provides substantially improved noise performance.

"Prior Art" FIG. 1A shows a conventional amplifier stage 1A which includes P-channel input transistors M1 and M2 having their sources coupled to current source 2, which produces a tail current $I_{tail1}$. The gates of transistors M1 and M2 are connected to Vin$^+$ and Vin$^-$, respectively. The drain of input transistor M1 is connected by conductor 5A to the (−) input of an output stage 13 and to the drain of a N-channel load transistor M3. The drain of input transistor M2 is connected by conductor 5B to the (+) input of output stage 13 and to the drain of a N-channel load transistor M4. The gates of load transistors M3 and M4 are connected to the gate and drain of a diode-connected N-channel current mirror input transistor M5 by means of conductor 16, which is also connected to a current source 3 producing a current $I_{tail1}/2$, which is mirrored through load transistors M3 and M4. The upper terminals of current sources 2 and 3 are connected to a supply voltage V$^+$. The sources of transistors M3, M4 and M5 are connected to ground. Output stage 13 accepts and amplifies differential signals on conductors 5A and 5B and feeds them back to transistors M6 and M7 during the auto-zero cycle. The (+) and (−) outputs of output stage 13 are connected to Vout$^+$ and Vout$^-$, respectively.

Referring to Prior Art FIG. 1B, the addition of transistors M6-M7, capacitors C$_1$ and C$_2$, tail current source 7 producing tail current $I_{tail2}$, four single pole, double throw switches (or switch circuits) 11A, 11B, 14 and 15 to differential amplifier stage 1A of FIG. 1A results in the conventional auto-zero amplifier 1B shown in FIG. 1B. Each of the switches has an "A" terminal to which the pole of the switch is connected during a time interval "A" and a "B" terminal to which the pole is connected during a time interval "B". A conductor 9 is connected between the "B" terminals of input switches 11A and 11B. Current source 7, which produces tail current $I_{tail2}$, is connected between V$^+$ and the sources of N-channel transistors M6 and M7, the gates of which are connected by conductors 17A and 17B to the upper terminals of capacitors C1 and C2, respectively, the lower terminals thereof being connected to ground. The drains of transistors M6 and M7 are connected to conductors 5A and 5B, respectively. Conductor 17A is connected to the B terminal of switch 15 and conductor 17B is connected to the B terminal of switch 14. The A terminal of switch 14 is connected to Vout$^+$ and the A terminal of switch 15 is connected to Vout$^-$. The pole terminal of switch 14 is connected by conductor 6A to the (+) output of output stage 13, and the pole terminal of switch 15 is connected by conductor 6B to the (−) output of output stage 13. Conventional external clocking and switch control circuitry (not shown) also are provided to ensure that all of the switches are opened and closed in the appropriate manner and at the appropriate times so as to cancel any input offset voltage of auto-zero amplifier 1B.

A modified auto-zero amplifier stage as shown in Prior Art FIG. 1C is sometimes used as the input stage for a programmable input offset canceling amplifier circuit. For example, the input stage topology of the prior art offset canceling auto-zero amplifier 1C in FIG. 1C consists of an auto-zero stage as shown in FIG. 1B with the further addition of a programmable precision offset reference voltage generator 18 coupled between the B terminals of input switches 11A and 11B. Offset reference voltage regulator 18 produces a programmable input offset reference voltage $V_{OSRef}$ as in the PGA309 programmable input reference voltage amplifier being marketed by the present assignee. The programmable offset voltage reference $V_{OSRef}$ in FIG. 1C replaces the short circuit conductor 9 connected between input switch terminals "B" in FIG. 1B so that the auto-zero portion of the circuit may be calibrated to a programmable input offset value instead of to "zero".

While prior art auto-zero amplifier stages are very effective for canceling small offset voltages produced as a result of device mismatches of transistors which are designed to be precisely matched, it should be noted that such auto-zero amplifier stages suffer substantial performance degradation when used to generate large values of the programmed input offset voltage $V_{OSRef}$. The performance degradation can include noise performance, which is the primary performance degradation. The performance degradation also can include $g_m$ (transconductance) variations which cause many other undesirable effects such as gain and slew rate variations, stability issues, stage power requirements etc.

It should be understood that by adding the offset voltage reference component $V_{OSRef}$ and significantly modifying transistor sizes and bias values, the prior art programmable auto-zero circuit 1C of FIG. 1C changes the operation of the auto-zero circuit of FIG. 1B from performing the function of eliminating small amplifier input offset voltages to the very different function of providing potentially large programmable input offset voltage values. While the simple auto-zero stage topology of FIG. 1B is known to excel at zeroing out (i.e. canceling or removing) the small offset voltages and drift created by device mismatches and errors, that topology suffers significant performance degradation when providing large programmed input offset values.

The following explanation of the circuit operation of auto-zero amplifier 1C of FIG. 1C and design trade-offs thereof reveals the causes of the foregoing performance degradation problems. The four switches 11A, 11B, 14 and 15 in FIG. 1C produce two distinctly different circuit topologies during the two alternating modes of operation during the previously mentioned alternating A and B time periods. In operation, the previously mentioned external clocking and driver circuits ensure that all switches change their positions simultaneously as the operating mode changes at the end of alternating A and B time periods. During time period A, all switches are set to the A position, and during time period B all switches are set to the B position. During the A time period, the circuit is a simple differential amplifier with an input offset caused by, among other factors, the charges stored on capacitors C$_1$ and C$_2$. Transistors M1 through M4 form a simple differential input stage that provides a differential current to the output stage of differential amplifier 1C. Any difference in voltage across capacitors C$_1$ and C$_2$ produces an imbalance in the drain currents of transistors M6 and M7 which, when reflected back through input transistors M1 and M2, produces an input offset voltage in programmable offset auto-zero amplifier 1C.

During time period B, the circuit of FIG. 1C does not operate as an amplifier at all, but rather as a calibration system used to capture an offset voltage across $C_1$ and $C_2$ that, when reflected through input transistors M1 and M2, produces an input offset voltage equal and opposite to the programmed reference voltage $V_{OSRef}$. The output conductors Vout⁻ and Vout⁺ do not provide an amplified signal during time period B. Instead the output signals on conductors 6B and 6A are fed back to charge capacitors $C_1$ and $C_2$, respectively, producing the differential voltage across transistors M6-M7 as required to null the differential current from input transistors M1 and M2 in response to the programmed offset voltage $V_{OSRef}$. Therefore, when the next A time period arrives, the circuit functions as a differential amplifier having an input offset voltage equal to that provided by $V_{OSRef}$ during the previous B time period. This way any desired value of input offset voltage may be produced at the input of amplifier 1C by programming $V_{OSRef}$ during time period B.

As may be seen by comparing FIGS. 1B and 1C, with the exception of $V_{OSRef}$, the topology of amplifier 1C is identical to that of a conventional auto-zero amplifier as shown in FIG. 1B. In order to provide a large input offset voltage range, device sizes and bias currents of auto-zero amplifier 1B are chosen which severely limit the performance of amplifier 1C. It should be understood that in the traditional auto-zero amplifier of FIG. 1B, only very small imbalances of current need to be canceled by means of transistors M6 and M7. These small imbalances are caused by mismatches of transistor pairs M1-M2 and M3-M4, which tend to be at most a few percent of $I_{tail1}$.

Therefore, when designing the circuit of FIG. 1B, one may choose $I_{tail2} \ll I_{tail1}$. In this case the bias current through input transistors M1 and M2 may remain unchanged while the current through transistors M3-M5 increases by only a few percent over the conventional non-auto-zero stage of FIG. 1A. Devices M1-M5 are therefore sized and optimized in the same way when designing the circuits of FIGS. 1A and 1B. This typically means choosing the transistor W(channel width)/L (channel length) ratios (hereinafter referred to as "Z" ratios or "geometry ratios"), the $g_m$'s, and the tail currents to minimize noise and power while matching them to the output stage so as to meet various bandwidth, slew-rate and other specifications. When considering input referred noise, gain, and bandwidth, the input transistor pair M1 and M2 transconductance ($g_m$) is especially important. For FETs (field effect transistors), $g_m$ is proportional to the square root of the transistor drain current and to its channel-width-to-channel-length ratio Z. To make the $g_m$ of the input transistor pair large, one would tend to make the channel widths (W) of input transistors M1 and M2 large, their channel lengths (L) small and the drain current of each (which is ½ $I_{tail1}$) large within the practical limits associated with these parameters.

It is well known that auto-zero amplifiers effectively eliminate low frequency noise and errors for frequencies significantly lower than the auto-zero switching frequency. It is also known that noise at frequencies above the auto-zero switching frequency may be folded back by auto-zero circuitry and appear as aliased noise to the circuit. Therefore, it is the higher frequency thermal noise that will be considered when noise is discussed herein. The noise analysis proceeds as though amplifier 1C were always in its amplifying mode. It should be noted that if thermal noise of an auto-zero amplifier is reduced (or increased) due to device design constraints of the circuit in a non-switched amplifying mode, then the noise of that circuit will also be reduced (or increased) when operated in a switching auto-zero mode.

As explained earlier, thermal noise performance is degraded in the prior art programmable input offset amplifier 1C of FIG. 1C when it is designed to provide a wide programmable input offset voltage range. This is due to conflicting device requirements when trying to optimize for both noise and for a wide offset voltage range. To understand this conflict, the thermal noise of the circuit devices is considered in the following manner. The square of the average thermal noise current $\overline{i^2}=4\,kT(\tfrac{2}{3}g_m)\Delta f$ generated by a FET (field effect transistor) is proportional to its $g_m$. (See "Analysis and Design of Analog Integrated Circuits", 3rd edition, Gray/Myer pp. 727). This is modeled as shown in FIG. 2, wherein each transistor in FIG. 1C is represented by an ideal FET (field effect transistor) with a noise generating current source coupled in parallel with its source and drain. The noise characteristics of amplifier 1C may be analyzed by noting that output stage 13 will amplify any differential noise current injected into its input conductors 5A and 5B. Since the circuits of FIGS. 1B and 1C are so similar, their noise analysis is also similar. It may be seen that the noise sources associated with transistors M1, M3 and M6 inject current noise into the inverting terminal (−) of the output stage while the noise sources from transistors M2, M4 and M7 inject into the non-inverting terminal (+). Therefore, all FET noise sources contribute to the overall amplifier noise (except for transistor M5, the noise source of which is mirrored equally by transistors M3 and M4 and therefore appears as common mode noise to the output stage and therefore is canceled. Similarly, noise from the $I_{tail1}$ and $I_{tail2}$ current sources is common mode noise when the $g_m$'s of transistors M1 and M2 and also M6 and M7 are balanced).

The total effect of the foregoing noise sources shown in Prior Art FIG. 2 may be combined into one equivalent noise voltage source at the input. This is done by transforming the current noise at the drain of input transistors M1 and M2 to noise at the gates of the transistors by dividing it by the $g_m$ of the input transistors M1 and M2. For the programmable input offset amplifier 1C as shown in FIG. 2, the total average noise current on the drain of transistor M1 is $\sqrt{4kT\left(\dfrac{2}{3}(g_{m1}+g_{m3}+g_{m6})\right)\Delta f}$, which transforms to a noise voltage source of value $$\dfrac{\sqrt{4kT\left(\dfrac{2}{3}(g_{m1}+g_{m3}+g_{m6})\right)\Delta f}}{g_{m1}}$$

in series with the gate of input transistor M1. Similarly an equivalent noise source at the gate of transistor M2 of $$\dfrac{\sqrt{4kT\left(\dfrac{2}{3}(g_{m2}+g_{m4}+g_{m7})\right)\Delta f}}{g_{m2}}$$

may be shown to represent the noise introduced by the noise sources associated with transistors M2, M4 and M7. These noise sources may be combined to provide a single equivalent input-referred average noise source with the value $$\sqrt{4kT\frac{2}{3}\Delta f \left[ \frac{g_{m1} + g_{m3} + g_{m6}}{g_{m1}^2} + \frac{g_{m2} + g_{m4} + g_{m7}}{g_{m2}^2} \right]}.$$

When designing the conventional auto-zero amplifier 1B of FIG. 1B, the designer may minimize thermal noise by making $g_{m1} \gg (g_{m3}+g_{m6})$ and $g_{m2} \gg (g_{m4}+g_{m7})$. This may be done by increasing the channel-width-to-channel-length (i.e., W/L) geometry ratio Z1 and Z2 of transistors M1 and M2, respectively, and by decreasing the geometry ratios Z3, Z4, Z6, and Z7 and decreasing $I_{tail2}$. Increasing $I_{tail1}$ also reduces noise, but it increases $g_{m1}$, $g_{m2}$, $g_{m3}$, and $g_{m4}$ simultaneously and is therefore not as effective as increasing Z1 and Z2. It is possible to decrease Z3 and Z4 to counter the effect of increased current but requirements on the available drain-to-source voltage $V_{DS}$ of transistors M3 and M4 constrain these parameters.

In the case of the standard auto-zero amplifier of FIG. 1B, where $I_{tail2}$ may be as low as only a few percent of $I_{tail1}$, it is relatively easy to ensure that $g_{m6,7} \ll g_{m1,2}$. The addition of transistors M6 and M7 therefore does not detract significantly from the thermal noise performance available in the simple non-auto-zero amplifier of FIG. 1A. Furthermore, since $I_{tail2} \ll I_{tail1}$, the current through transistors M3 and M4 does not change significantly with the addition of $I_{tail2}$ and therefore their required sizes are not substantially different than they would be in the simple non-auto-zero amplifier of FIG. 1A.

In other words, the addition of the auto-zero circuitry of FIG. 1B to the conventional differential amplifier stage 1A of FIG. 1A does not substantially change $g_{m3}$ or $g_{m4}$ or their contribution to thermal noise. The auto-zero stage may perform very nearly the same as a simple amplifier would when optimized for thermal noise. Similar analysis shows that other performance parameters such as bandwidth, gain and slew rate also are strongly affected by the $g_m$ of the input transistor and are not substantially changed by the addition of a small auto-zero differential pair when designed to nullify only small mismatch-generated offset voltages.

Therefore, in most respects auto-zero amplifier 1B of FIG. 1B may be easily designed to perform as well as the simple amplifier of FIG. 1A but with the added benefit of very low input offset and drift. However, when the stage 1C of FIG. 1C is required to produce large programmed input offset voltages such as +/−50 to +/−100 millivolts (as would be highly desirable), it is no longer possible to ensure that $I_{tail1} \gg I_{tail2}$. In fact, for the circuit of FIG. 1C to provide such large input offset values, it is required that $I_{tail2}$ is approximately equal to $I_{tail1}$, so that the current densities of transistors M1 and M2 may vary widely. It is the difference in overdrives ($V_{GS}$-$V_T$) of the input transistors M1 and M2 that produces the programmed input offset voltage in the circuits of FIGS. 1C and 2. The overdrives $V_{GS}$-$V_T$ of the input transistors M1 and M2 are a relatively weak function (i.e., the square root) of their drain currents since $$V_{gs} - V_T = \sqrt{\frac{I_D}{kZ}}.$$

When $I_{tail1}$ is evenly divided between transistors M1 and M2, both operate with an identical overdrive of $$\sqrt{\frac{I_{tail1}}{2kZ}}$$

and there is no input offset voltage. By unbalancing the currents through transistors M1 and M2, offset voltages up to a maximum of $$\pm\sqrt{\frac{I_{tail1}}{kZ}}$$

may be programmed.

As may be seen from the graph in FIG. 3, which shows Normalized Input Offset vs Current in Transistor M1, a current imbalance between input transistors M1 and M2 of 93% to 7% of $I_{tail1}$ is required to provide an input offset voltage of $$\sqrt{\frac{I_{tail1}}{2kZ}}$$

at the input terminals. Note that the Y axis is normalized to $$\sqrt{\frac{I_{tail1}}{2kZ}}$$

and the Y axis values of +1 and −1 correspond to the X axis % values of 7% and 93% of $I_{tail1}$ in transistor M1. Even to reach this value, which is 70% of the theoretical maximum available offset, an input device current density difference of more than 13 times is required between transistors M1 and M2. An even larger overdrive is required if substantially more input offset range is desired. A substantially wider input offset range may be obtained either by (1) increasing $I_{tail1}$ or (2) decreasing the geometry ratio Z of transistors M1 and M2, or both. However, neither option is desirable if minimizing input-referred thermal noise or overall power are important.

Above-mentioned option (1), increasing $I_{tail1}$, requires a corresponding increase in $I_{tail2}$, which increases the $g_m$ of all of the transistors. The input-referred thermal noise decreases because of the increase of the $g_m$ of the input transistors, but this is countered somewhat by the increased noise current from the other transistors and the significantly increased power dissipation of the circuit (the power dissipation increases with the square of the input offset range).

Above-mentioned option (2) for providing substantially more input offset range is to decrease the size of the input transistors (i.e., decrease Z1 and Z2), which increases the overdrive $V_{GS}$-$V_T$ of the input transistors M1 and M2 and therefore increases the programmable offset range. Unfortunately, decreasing the geometry ratio Z of input transistors M1 and M2 also decreases the $g_m$ of the pair of input transistors, which significantly increases the input-referred noise of the amplifier stage. The increased power and/or noise described above occurs in programmable offset amplifier 1C as shown in FIGS. 1C and 2 for all programmed offset voltage values (even zero) because of the required changes in transistor geometry ratios Z and bias conditions. The problems become worse when a large input offset voltage is programmed due to the significant decrease of the $g_m$ of the input transistor M1 or M2, with its lower current density. (When the current in the input transistors is unbalanced, one of them has increased current and therefore an increased $g_m$ and the other input transistor has decreased current and therefore a decreased $g_m$. The net effect is to decrease the $g_m$ of the input pair of transistors, wherein the input transistor having the lower $g_m$ dominates the $g_m$ of the pair.) For example, the case of 93% of $I_{tail1}$ in transistor M1 and 7% in transistor M2 described above produces an input offset voltage of $$\sqrt{\frac{I_{tail1}}{2kZ}}.$$

The $g_m$ of transistor M2 decreases to $$\sqrt{\frac{7}{50}} = 37\%$$

of its nominal value while the $g_m$ of transistor M1 increases to $$\sqrt{\frac{93}{50}} = 136\%$$

of its nominal value. The noise currents generated by transistors M2, M7 and M4 change by −39%, +17% and 0%, respectively. The total noise reflected through transistor M2 to the input is more than double the value for the case with no programmed offset. The noise reflected to the input through transistor M1 actually decreases slightly because of its increased $g_m$, but not enough to begin to compensate for the large increase in noise reflected through transistor M2. In addition, since the $g_{m1}$ and $g_{m2}$ now differ, noise on $I_{tail1}$ that was previously canceled by the matched input transistor pair now contributes to the input-referred noise. Another undesirable consequence of programming a large offset is that the effective differential $g_m$ of the front end transistor pair M1,M2 is also substantially reduced from its nominal value, which changes all other amplifier specifications that depend on the front end $g_m$, such as gain, bandwidth, etc.

In summary, the problem of prior art programmable offset amplifier 1C of FIG. 1C is that a large imbalance in current density through input transistors M1 and M2 is required to produce a large input offset voltage. This is obtained by changing bias currents and transistor geometry ratios from otherwise optimal values, which results in significantly degraded noise, gain, bandwidth and power performance relative to a comparable non-offset generating amplifier. Furthermore, significant tail current is added to the auto-zero stage which ultimately adds noise and power to the devices that carry it.

Thus, there is an unmet need for a programmable offset-canceling amplifier and method which provide a large input offset voltage range and which also avoid the substantial performance degradation that occurs in the prior art when large values of input offset voltage are provided.

There also is an unmet need for a programmable input-offset-canceling amplifier and method which provide a large input offset voltage range and also avoid substantially degraded noise, gain, bandwidth, and power performance caused by changing bias currents and transistor geometry ratios from otherwise optimal values.

There also is an unmet need for a programmable offset-canceling amplifier and method that operate with substantially lower low-noise switching glitches and substantially lower clock feed-through glitches than the prior art.

There also is an unmet need for a programmable offset-canceling amplifier and method that improve the noise performance over the prior art while providing twice its input offset canceling range.

SUMMARY OF THE INVENTION

It is an object of the invention to provide a programmable offset-canceling amplifier and method which provide a large input offset voltage range and which also avoid the substantial performance degradation that occurs in the prior art when large values of input offset voltage are provided.

It is another object of the invention to provide a programmable input-offset-canceling amplifier and method which provide a large input offset voltage range and also avoid substantially degraded noise, gain, bandwidth, and power performance caused by changing bias currents and transistor geometry ratios from otherwise optimal values.

It is another object of the invention to provide a programmable offset-canceling amplifier and method that operate with substantially lower low-noise switching glitches and substantially lower clock feed-through glitches than the prior art.

It is another object of the invention to provide a programmable offset-canceling amplifier and method that improve the noise performance over the prior art while providing twice its input offset canceling range.

Briefly described, and in accordance with one embodiment, the present invention provides a programmable offset amplifier including first (M1) and second (M2) input transistors differentially connected first electrodes, i.e., sources, and control electrodes, i.e., gates, coupled to first (Vin$^+$) and second (Vin$^-$) input voltages. A tail current ($I_{tail1}$) is shared between the first and second input transistors. First (M3) and second (M4) load devices are coupled between a reference voltage and second electrodes, i.e., drains, of the first and second input transistors, respectively. An output stage (13) has a first input (+) coupled to the second electrode of the second input transistor and a second input (−) coupled to the second electrode of the first input transistor. Programmable voltage changes are produced on input elements of programmable input offset circuitry to cause changes in offset voltages associated with electrodes of the input transistors which are reflected back to the amplifier input to provide a large programmable input-referred offset voltage.

In one embodiment, the invention provides programmable input offset voltage amplifier circuitry including first (M1) and second (M2) input transistors having first electrodes coupled together and having control electrodes coupled to first (Vin$^+$) and second (Vin$^-$) input voltages, respectively. A first tail current ($I_{tail1}$) is directed so as to be shared between the first (M1) and second (M2) input transistors. First (M3) and second (M4) load devices are coupled between a reference voltage (GND) and second electrodes of the first (M1) and second (M2) input transistors, respectively. Programmable input offset circuitry includes input elements for producing programmable voltage changes across the input elements so as to produce corresponding changes in voltages of at least one of the first (M1) and second (M2) input transistors to cause the internal voltage changes to be reflected back to an input voltage (Vin$^+$−Vin$^−$) applied between the control electrodes of the first (M1) and second (M2) input transistors. An output stage (13) having a first input (+) is coupled to the second electrode (5B) of the second input transistor (M2) and a second input (−) is coupled to the second electrode (5A) of the first input transistor (M1). In a described embodiment, the transistors are field effect transistors, wherein the first electrodes are sources, the second electrodes are drains, and the control electrodes are gates.

In various embodiments of the invention, the input elements include one or more of the first (M1) and second (M2) input transistors, an offset resistor (22) coupled between the sources of the first (M1) and second (M2) input transistors, a variable offset resistance element (22A) coupled between the sources of the first (M1) and second (M2) input transistors, a first portion ($X \times I_{tail1}$) and a second portion (($1-X) \times I_{tail1}$) of the first tail current ($I_{tail1}$), and a plurality of transistor segments (M1-1,2..., M2-1,2...) from which the first (M1) and second (M2) input transistors can be formed by means of a plurality of associated switches (S1,2...).

In a described embodiment, the first and second load devices include first (M3) and second (M4) current mirror output transistors, respectively, and the programmable offset amplifier circuitry includes a current mirror input transistor (M5) having a gate and a drain coupled to a first current source (3) and gates of the first (M3) and second (M4) current mirror output transistors.

In one embodiment, the programmable input offset circuitry includes a plurality of programmable input transistor segments (M1-1,2,3, M2-1,2,3) and associated switches (S1,2 ... 12) from which the first (M1) and second (M2) input transistors are formed so as to balance portions of the first tail current ($I_{tail1}$) flowing through the first (M1) and second (M2) input transistors, respectively.

In a more preferred embodiment, the programmable input offset circuitry includes an offset resistor (R) coupled between the sources of the first (M1) and second (M2) input transistors. In one embodiment, the programmable offset circuitry includes a first programmable current source (2A) producing first programmable portion ($X \times I_{tail1}$) of the first tail current ($I_{tail1}$) coupled to the source (24A) of the first input transistor (M1), and a second programmable current source (2B) produces a second programmable portion (($1-X) \times I_{tail1}$) of the first tail current ($I_{tail1}$) coupled to the source (24B) of the second input transistor (M2).

In one embodiment, the programmable offset circuitry includes a switch (26) having a pole terminal coupled to receive the first tail current ($I_{tail1}$) a first terminal (A) coupled to the source (24A) of the first input transistor (M1) and a second terminal (B) coupled to the source (24B) of the second input transistor (M2).

In another embodiment, the programmable offset amplifier circuitry includes a programmable offset resistance (22A) coupled between the sources of the first (M1) and second (M2) input transistors, a first programmable current source (2A) producing first programmable portion ($X \times I_{tail1}$) of the first tail current ($I_{tail1}$) coupled to the source (24A) of the first input transistor (M1), and a second programmable current source (2B) producing a second programmable portion (($1-X) \times I_{tail1}$) of the first tail current ($I_{tail1}$) coupled to the source (24B) of the second input transistor (M2). The first programmable current source (2A) and the second programmable current source (2B) may be implemented by means of a current DAC (digital to analog converter) (2).

In one embodiment, first auto-zero circuitry (11A,B) is coupled between the first (Vin+) and second (Vin$^−$) input voltages and the gates of the first (M1) and second (M2) input transistors, respectively, and second auto-zero circuitry (C1, 2, M6,7, 7, 14, 15) is coupled to (+) and (−) outputs of the output stage (13).

In one embodiment, a programmable offset reference voltage source (18) is controllably coupled between the gates of the first (M1) and second (M2) input transistors to produce a programmable offset reference voltage ($V_{OSRef}$) between the gates of the first (M1) and second (M2) input transistors. First auto-zero circuitry (11A,B) is coupled between the first (Vin$^+$) and second (Vin$^−$) input voltages and the gates of the first (M1) and second (M2) input transistors, respectively, and second auto-zero circuitry (C1,2, M6,7, 7, 14, 15) is coupled to (+) and (−) outputs of the output stage (13).

In one embodiment, a plurality of substantially identical programmable offset amplifiers (30-1,2,3,4) are provided on a single integrated circuit chip (50) and logic circuitry (51) is also included on the chip for sequentially comparing the programmable offset reference voltage ($V_{OSRef}$) to internal voltage changes previously programmed into the plurality of substantially identical programmable offset amplifiers to eliminate any differences between the programmable offset reference voltage ($V_{OSRef}$) and the internal voltage changes previously programmed into the plurality of substantially identical programmable offset amplifiers, respectively. In one embodiment, the first auto-zero circuitry includes a first switch (11A) having a pole terminal (8A) coupled to the gate of the first input transistor (M1) and a second switch (11B) having a pole terminal (8B) coupled to the gate of the second input transistor (M2). The first switch (11A) has a first terminal (A) coupled to the first (Vin$^+$) input voltage and the second switch (11B) has a first terminal (A) coupled to the second (Vin$^−$) input voltage. The first switch (11A) has a second terminal (B) coupled to a first terminal of the programmable offset reference voltage source (18) and the second switch (11B) has a second terminal (B) coupled to a second terminal of the programmable offset reference voltage source (18). The second auto-zero circuitry includes a third switch (14) having a pole terminal (6A) coupled to a first output (+) of the output stage (13) and a fourth switch (15) having a pole terminal (6B) coupled to a second output (−) of the output stage (13). The third switch (14) has a first terminal (A) coupled to a first output voltage (Vout$^+$), and the fourth switch (15) has a first terminal (A) coupled to a second output voltage (Vout$^−$). The third switch (14) has a second terminal (B) coupled to a gate of a first transistor (M7) and a terminal of a first capacitor (C2) which has another terminal coupled to the reference voltage (GND). The fourth switch (15) has a second terminal (B) coupled to a gate of a second transistor (M6) and a terminal of a second capacitor (C2) which has another terminal coupled to the reference voltage (GND). Drains of the first (M7) and second (M6) transistors are coupled to drains of the second (M2) and first (M1) transistors, respectively. Sources of the first (M7) and second (M6) transistors are coupled to receive a second tail current ($I_{tail2}$).

In one embodiment, the invention provides a method for operating a programmable input offset voltage amplifier circuit, comprising providing first (M1) and second (M2) input transistors having first electrodes coupled together and having control electrodes coupled to first (Vin$^+$) and second (Vin$^−$) input voltages, respectively, a tail current ($I_{tail1}$) directed so as to be shared between the first (M1) and second (M2) input transistors, first (M3) and second (M4) load devices coupled between a reference voltage (GND) and second electrodes of the first (M1) and second (M2) input transistors, respectively, and an output stage (13) having a first input (+) coupled to the second electrode (5B) of the second input transistor (M2) and a second input (−) coupled to the second electrode (5A) of the first input transistor (M1), producing programmable voltage changes on input elements of programmable input offset circuitry to cause corresponding changes in offset voltages associated with corresponding electrodes of the first (M1) and second (M2) input transistors, respectively, and causing the corresponding changes in offset voltages to be reflected back to an input voltage (Vin$^+$−Vin$^-$) applied between the control electrodes of the first (M1) and second (M2) input transistors to present a corresponding programmable large input-referred offset voltage between the control electrodes of the first (M1) and second (M2) input transistors. Geometry ratios of the first (M1) and second (M2) input transistors and a value of the tail current ($I_{tail1}$) are provided so as to avoid substantially degraded noise, gain, bandwidth, and power performance.

In one embodiment, the invention includes producing programmable voltage changes on a programmable offset resistance (22A) coupled between the first electrodes of the first (M1) and second (M2) input transistors and also producing programmable voltage changes in a first programmable current source (2A) coupled to the first electrode (24A) of the first input transistor (M1) by producing a first programmable portion (X×$I_{tail1}$) of the tail current ($I_{tail1}$) and also producing programmable voltages in a second programmable current source (2B) coupled to the first electrode (24B) of the second input transistor (M2) by producing a second programmable portion ((1−X)×$I_{tail1}$) of the tail current ($I_{tail1}$).

In one embodiment, the invention includes programming a programmable offset reference voltage source (18) to produce a programmable offset reference voltage ($V_{OSRef}$) between the control electrodes of the first (M1) and second (M2) input transistors, and also operating first auto-zero circuitry (11A,B) coupled between the first (Vin$^+$) and second (Vin$^-$) input voltages and the control electrodes of the first (M1) and second (M2) input transistors, respectively, along with second auto-zero circuitry (C1,2, M6,7, 7, 14, 15) coupled to (+) and (−) outputs of the output stage (13).

In one embodiment, the invention includes providing a plurality of substantially identical programmable offset amplifier circuits and sequentially comparing the programmable offset reference voltage ($V_{OSRef}$) to internal voltage changes previously programmed into the plurality of substantially identical programmable offset amplifiers and performing auto-zero operations to eliminate any differences between the programmable offset reference voltage ($V_{OSRef}$) and the internal voltage changes previously programmed into the plurality of substantially identical programmable offset amplifiers, respectively.

In one embodiment, the invention provides programmable input offset voltage amplifier circuitry including first (M1) and second (M2) input transistors having first electrodes coupled together and having control electrodes coupled to first (Vin$^+$) and second (Vin$^-$) input voltages, respectively, a first tail current ($I_{tail1}$) being directed so as to be shared between the first (M1) and second (M2) input transistors, first (M3) and second (M4) load devices coupled between a reference voltage (GND) and second electrodes of the first (M1) and second (M2) input transistors, respectively, and an output stage (13) having a first input (+) coupled to the second electrode (5B) of the second input transistor (M2) and a second input (−) coupled to the second electrode (5A) of the first input transistor (M1), means (R,2A,B,M1-1,2 . . . , S1,2 . . . , X×$I_{tail1}$) for producing programmable voltage changes on input elements of programmable input offset circuitry to cause corresponding changes in offset voltages associated with corresponding electrodes of the first (M1) and second (M2) input transistors, and means (M1,2) for causing the corresponding changes in the offset voltages to be reflected back to an input voltage (Vin$^+$−Vin$^-$) applied between the control electrodes of the first (M1) and second (M2) input transistor to present a large programmable input-referred offset voltage (18) between the control electrodes of the first (M1) and second (M2) input transistors.

DETAILED DESCRIPTION OF THE PREFERRED EMBODIMENTS

The present invention provides an amplifier input stage having a large programmable input offset voltage range that improves noise performance and decreases power dissipation, yet does not significantly decrease other measures of performance when compared to a conventional programmable offset amplifier (e.g., FIG. 1C) with a comparably large input offset voltage range.

Figure 4:
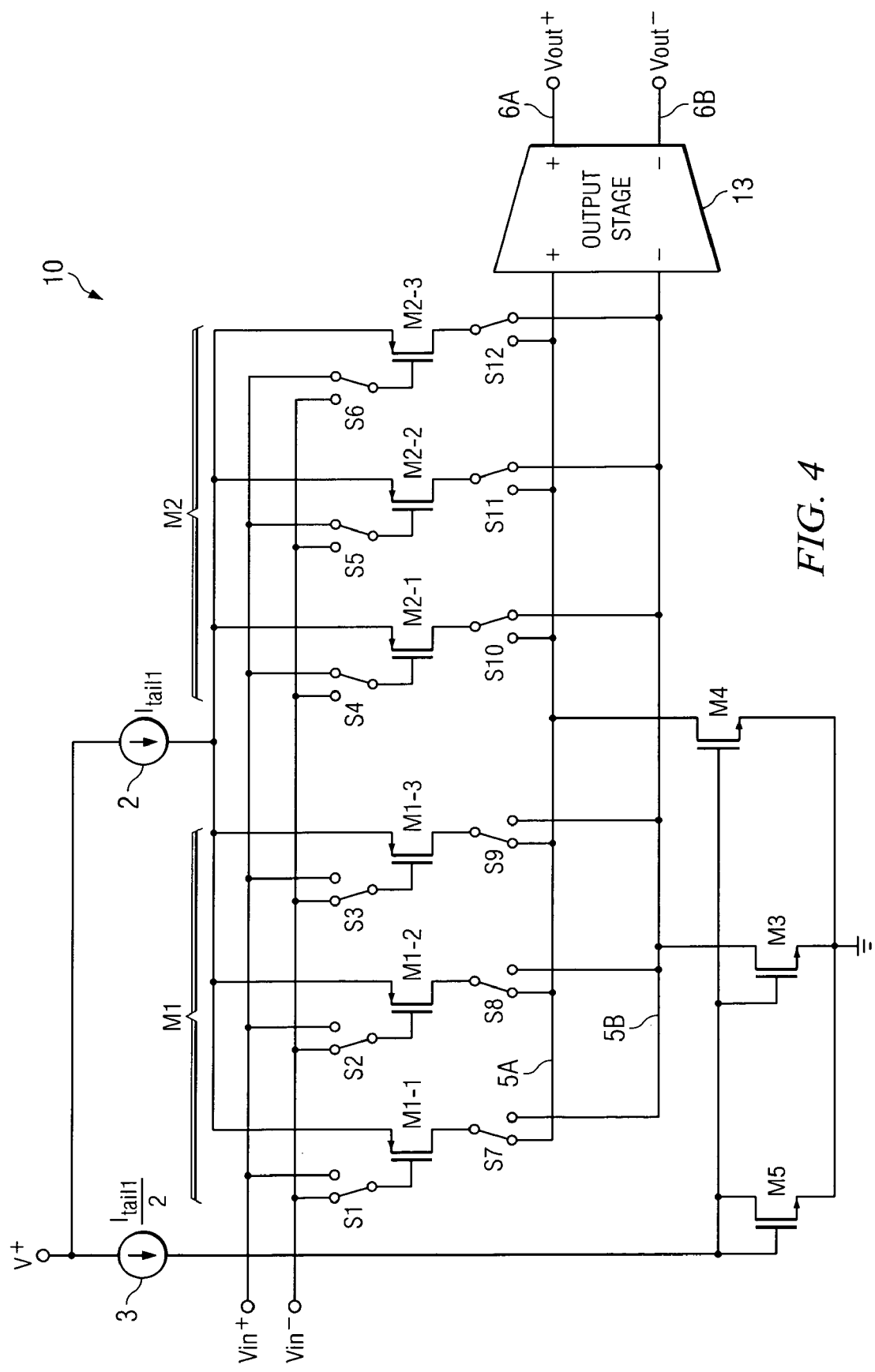
FIG. 4 is a simplified schematic diagram of one programmable offset amplifier of the present invention.

The programmable input offset amplifier 10 of FIG. 4 provides a method of programmably changing the relative sizes of "composite" input transistors M1 and M2 without changing the balance of the portions of the total tail current $I_{tail1}$ therein. Composite input transistors M1 and M2 are constructed from a "pool" of "device segments" and switches by connecting the various segments to become part of either of composite transistors M1 and M2, as illustrated in FIG. 4. Referring to FIG. 4, programmable offset amplifier 10 includes current sources 2 and 3, current mirror input transistor M5, load transistors M3 and M4, and output stage 13 connected as in Prior Art FIG. 1A. In FIG. 4, input transistors M1 and M2 are programmably "assembled" from the above mentioned pool of various transistor "segments". For example, input transistor M1 can be assembled from some or all of the above mentioned pool of transistor segments M1-1, M1-2, and M1-3 by means of switches S1-3 and S7-9. (Note that in practice more than 3 segments ordinarily would be used to provide increased granularity.) Similarly, input transistor M2 can be assembled from some or all of transistor segments M2-1, M2-2, and M2-3 by means of switches S4-6 and S10-12.

The sources of the transistor segments are connected to the lower terminal of current source 2. The gates of the various transistor segments are connected to the pole terminals of the various switches S1-6 so that the gates of a suitable number of M1 transistor segments can be connected to Vout⁻ and the gates of a suitable number of M2 transistor segments can be connected to Vout⁺. The drains of the various M1 transistor segments are connected to the pole terminals of the various switches S7-9 so that the drains of a suitable number of M1 transistor segments can be connected by conductor 5A to the (+) input of output stage 13. Similarly, the drains of the various M2 transistor segments are connected to the pole terminals of the various switches S10-12 so that the drains of a suitable number of M2 transistor segments can be connected by conductor 5B to the (−) input of output stage 13.

The various switches shown in FIG. 4 are controlled so as to program the balance of fractions of current $I_{tail1}$ in composite input transistors M1 and M2 by adding or subtracting various transistor segments to either of the two composite input transistors. If an equal number of transistor segments are "assigned" to each of composite transistors M1 and M2 they are identical, so in that case the programmable offset amplifier 10 performs exactly as an ideal, optimized differential amplifier as shown in Prior Art FIG. 1A. However, by assigning unequal numbers of transistor segments to composite transistors M1 and M2, their current densities can be varied without changing the amounts of tail current through each of composite input transistors M1 and M2, and that correspondingly changes their gate-to-source overdrive voltages, which are a function of their respective current densities, and a programmable input offset voltage of amplifier 10 is obtained.

Figure 1A:
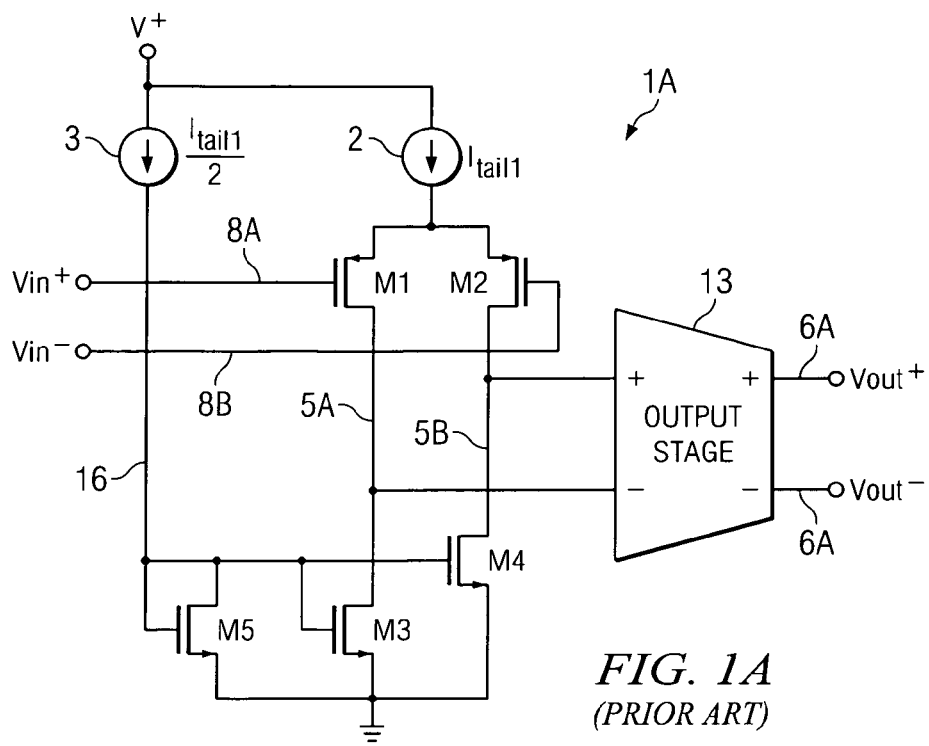
FIG. 1A is a schematic diagram of a conventional differential amplifier circuit.
Figure 1B:
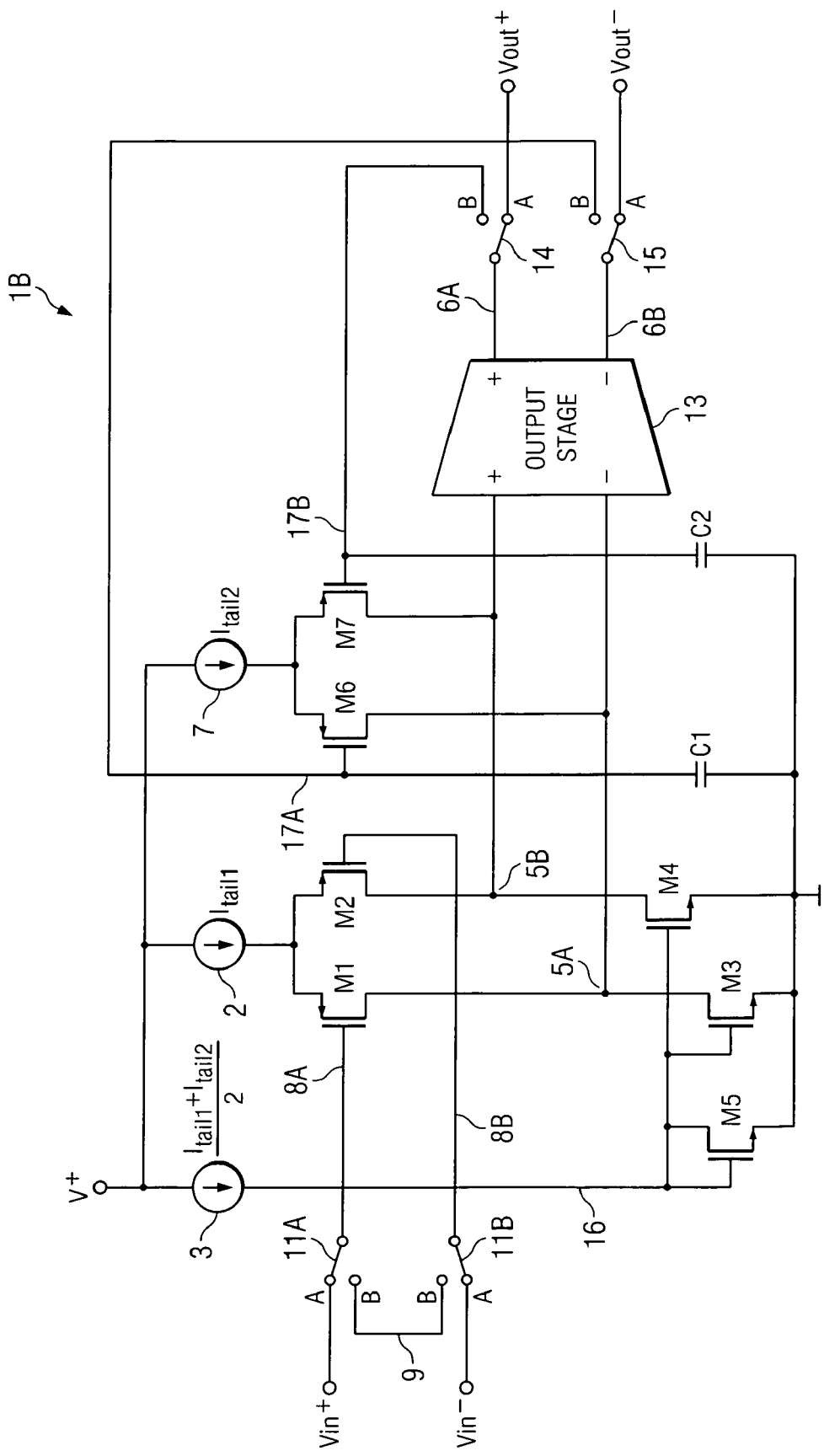
FIG. 1B is a schematic diagram of a conventional auto-zero amplifier circuit.
Figure 1C:
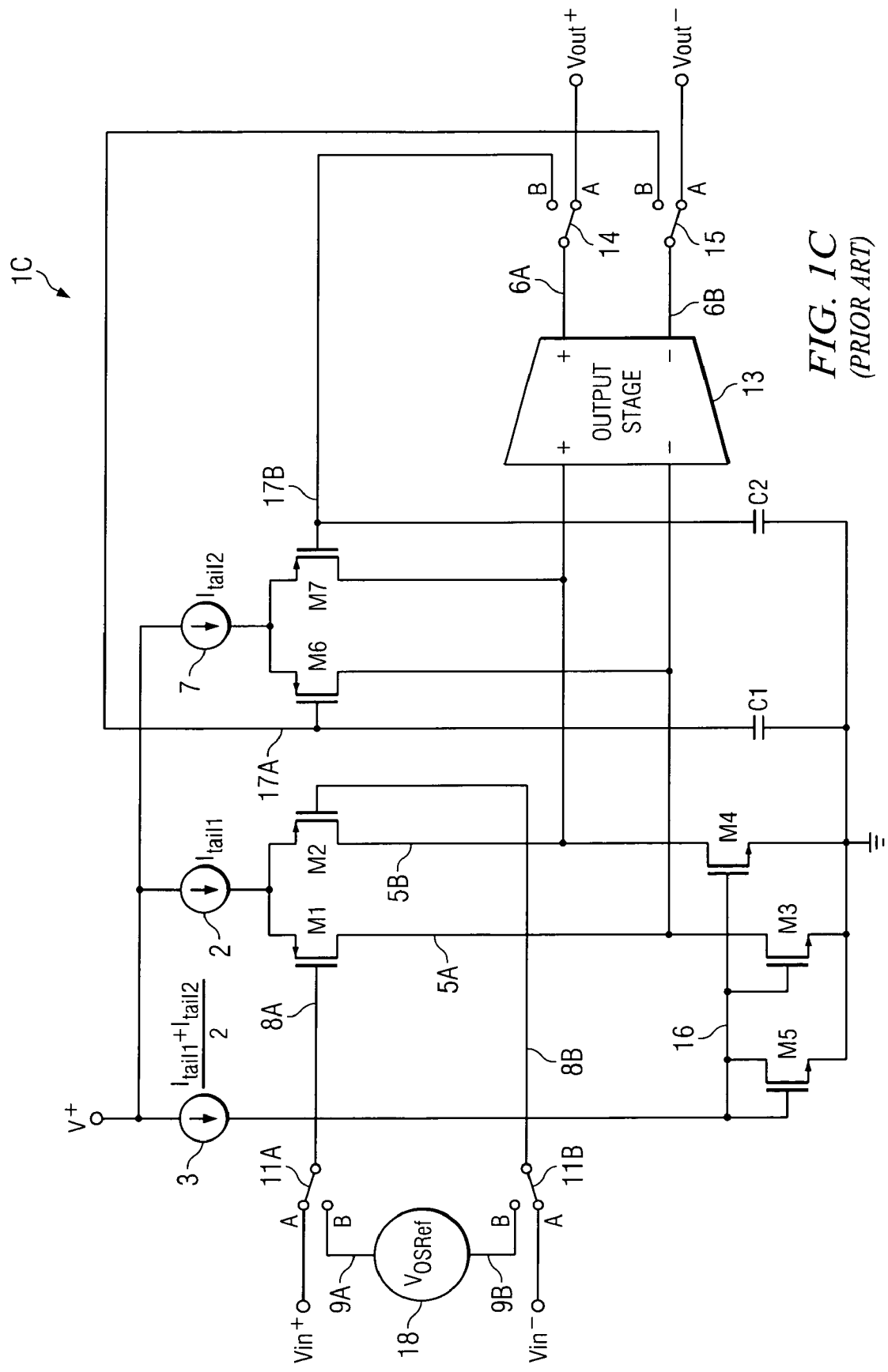
FIG. 1C is a schematic diagram of a conventional auto-zero amplifier circuit having programmable input offset voltages.
Figure 2:
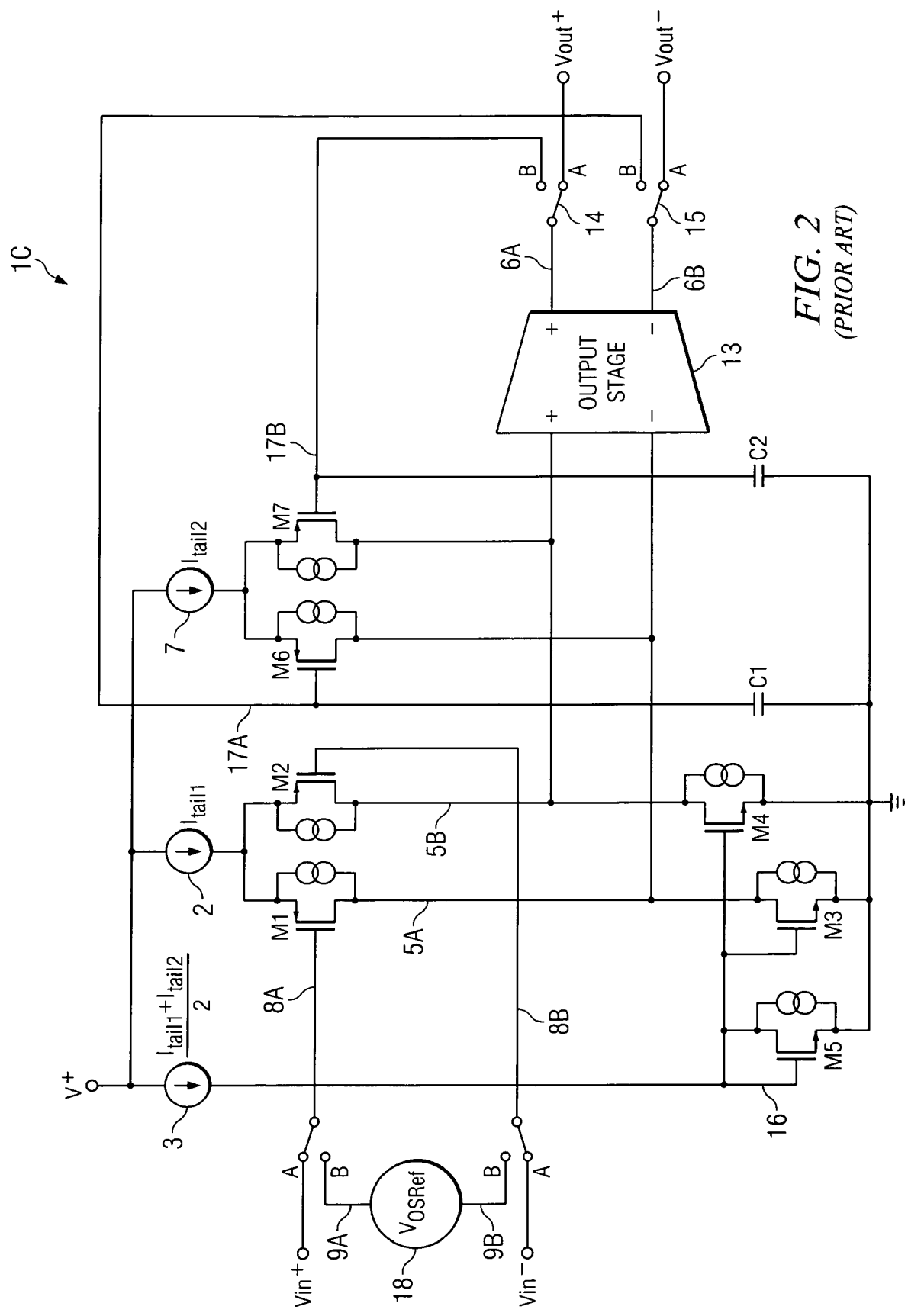
FIG. 2 is a schematic diagram showing the noise sources associated with each of the transistors in FIG. 2.

When compared to the programmable offset circuit numeral 1C of Prior Art FIGS. 1C and 2, it is seen that in programmable offset amplifier 10 of FIG. 4 there is no noise contribution of the kind generated by transistors M6 and M7 in FIG. 2, as they are not needed to produce the desired large input offset. The noise currents contributed by transistors M3 and M4 in FIG. 4 are smaller than in the circuit of Prior Art FIGS. 1C and 2 because the bias currents through them would not need to be increased over the current through the corresponding transistors in an ideal optimized input stage as in FIG. 1A. However, the transconductance $g_m$ of the input transistor M1 or M2 in FIG. 4 having fewer segments decreases due to a reduction in its effective geometry ratio Z. Therefore the noise reflected through that input transistor to the differential input Vout⁺−Vout⁻ increases or decreases as composite input transistors M1 and M2 are programmed so as to become imbalanced, depending on which one has the higher current density.

The noise performance of the circuit 10 in FIG. 4 matches the noise performance of an ideal amplifier stage if composite transistors M1 and M2 are programmed to be equal, and becomes degraded with increased input offset voltage if the $g_m$ of one of the composite transistors is smaller. Although the noise increases with programmed input offset voltage (sometimes referred to herein simply as "offset") the noise performance nevertheless is much better than that of the circuit of Prior Art FIGS. 1C and 2 at all values of offset because the only factors contributing to increased noise in the circuit of FIG. 4 come from the decreased $g_m$ of one of the composite input transistors M1 and M2 and the amount of tail current imbalance that this creates. Since $g_{m1}$ and $g_{m2}$ are no longer balanced, noise from the tail current is reflected unevenly through input transistors M1 and M2 and therefore is no longer canceled as common mode noise. A wide range and fine granularity of programmable input offset voltage may be obtained by providing a sufficient number of the small transistor segments to produce sufficiently large and/or sufficiently small input geometry ratios of the composite input transistors.

While much better than the prior art, two major problems nevertheless exist with amplifier 10 of FIG. 4. First, the offset voltage produced is a function of transistor parameters that vary between various batches of semiconductor wafers and that also vary with temperature. Therefore it is difficult to provide accurate programmed offset values across typical temperature and semiconductor manufacturing process variations. Second, since the input $g_m$ varies over a wide range, the other amplifier parameters that depend on the input $g_m$, such as gain and bandwidth, also vary substantially when using amplifier 10 of FIG. 4.

Figure 5:
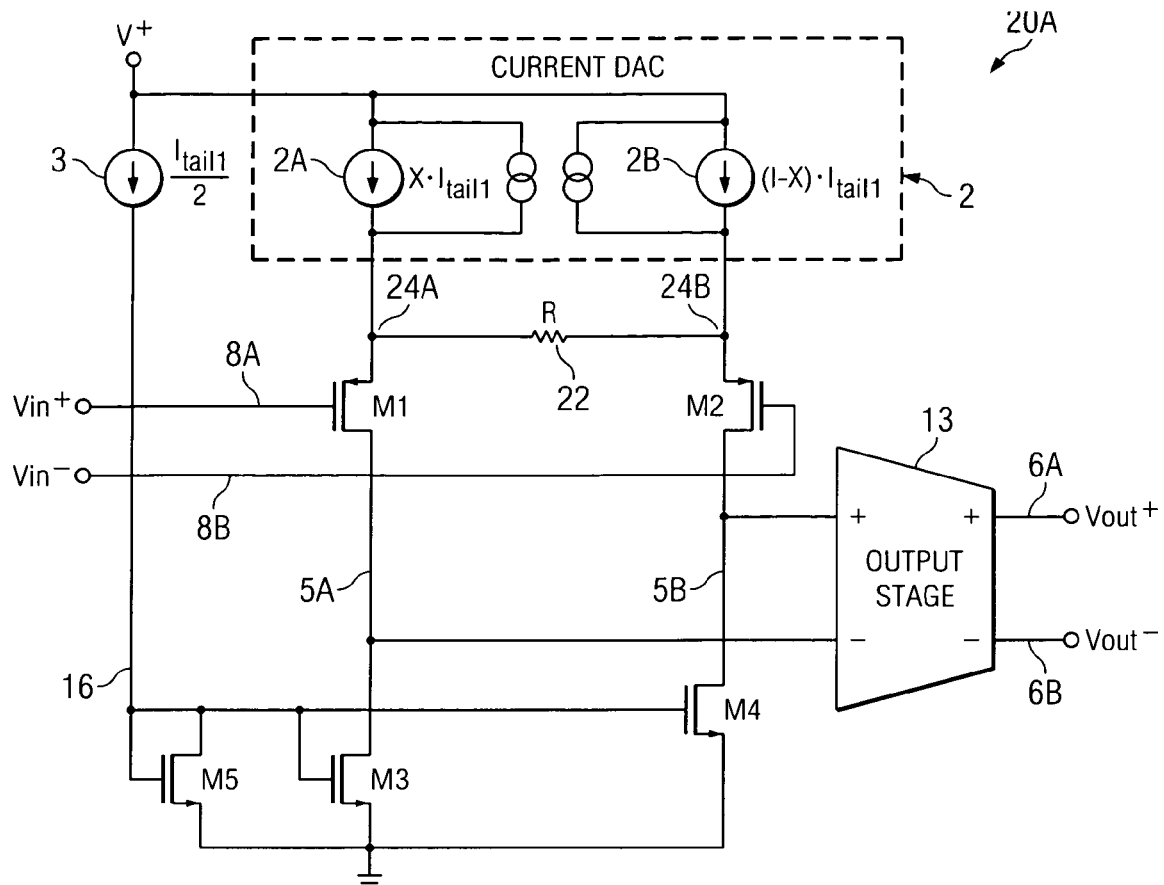
FIG. 5 is a simplified schematic diagram of another programmable offset amplifier of the present invention.

Another more practical solution to the previously described problems of the prior art is shown in FIG. 5. In FIG. 5, programmable input offset amplifier 20A includes current source 3, transistors M3-5, and output stage 13 connected as in Prior Art FIG. 1A, and also includes input transistors M1 and M2, the gates and drains of which are connected as in Prior Art FIG. 1A. However, in FIG. 5 an offset resistor 22 of resistance R is connected between the sources of input transistors M1 and M2 by means of conductors 24A and 24B, respectively. A current source 2A producing a current $X \times I_{tail1}$ is connected between V⁺ and conductor 24A, wherein X is varied to program the input offset voltage of amplifier 20A. The currents through input transistors M1 and M2 remain at the value $I_{tail1}/2$ in order to match the current in current source output transistors M3 and M4. Similarly, a current source 2B producing a current $(1−X) \times I_{tail1}$ is connected between V⁺ and conductor 24B. A current flows through offset resistance R to make up the difference between current sources 2A and 2B and to set the input offset voltage of amplifier stage 20A.

In programmable input offset amplifier 20A of FIG. 5, offset resistor 22 generates the input offset voltage as its IR voltage drop when driven by the two "split" portions $X \times I_{tail1}$ and $(1−X) \times I_{tail1}$ of the tail current $I_{tail1}$. The programmable input offset voltage is directly controlled by varying the split tail current balance fraction X and/or by varying the value of resistor R. Like the option of FIG. 4, none of the currents through the various transistors change as a function of the input offset voltage, but unlike the option of FIG. 4, the geometry ratio and $g_m$ of the input transistors M1 and M2 are constant. This results in good noise performance and also in more consistent gain and bandwidth performance across the full range of programmed input offset voltage.

However, while superior to the circuit 1C of Prior Art FIGS. 1C and 2, the implementation using split tail current and resistor R is not completely free of adverse effects. The introduction of resistor R between the sources of input transistors M1 and M2 introduces two new sources of noise. First resistor R produces its own thermal noise on conductors 24A and 24B, which is reflected directly to the input terminals 8A and 8B. Second, uncorrelated current noise in the split tail current circuit produces IR voltage drop noise in offset resistor R which also is reflected to input terminals 8A and 8B. In addition, the effective differential $g_m$ of input transistors M1 and M2 is reduced by the presence of resistor R. Therefore input transistors M1 and M2 are less effective at reducing noise reflected through them to the input Vin⁺−Vin⁻. However, unlike amplifier 10 of FIG. 4, the $g_m$ of transistors M1 and M2 in FIG. 5 does not change appreciably with offset voltage unless R is large and varies substantially. Therefore, all of the performance parameters that depend on the input $g_m$ are more consistent throughout the full range of offset voltage in amplifier 20A of FIG. 5.

The effective transconductance $g_m$ of the input transistor pair M1,M2 together with offset resistor R becomes $$g_{mEffective} = \frac{g_m}{1 + R \cdot g_m}.$$

Therefore, if $R \times g_m \ll 1$ there is little effect on the stage transconductance $g_m$. When $R \times g_m$ becomes significant, the geometry ratio Z1,2 of input transistors M1 and M2 may be increased to reclaim the "lost" value of $g_m$. As in the simple optimized amplifier of Prior Art FIG. 1A, transistors M1 through M4 contribute noise current at the input of output stage 13 that is reflected to the input $Vin^+$-$Vin^-$ by dividing that contributed noise by the input transconductance $g_{mEffective}$.

Note that the reflecting of internal noise to the input of an amplifier is really a circuit analysis technique that calculates how large a noise source would have to be at the input of a circuit to produce an equivalent amount of noise in the circuit as a real source of noise located somewhere else in the circuit. Transistors M1-M4 introduce noise onto nodes 5A and 5B. The effect of that noise on the circuit is the same as adding a noise source on the amplifier input that is $1/g_m$ as large as the noise introduced onto nodes 5A and 5B because input transistors M1 and M2 amplify signals, including noise, on the input by $g_m$ to produce the currents in conductors 5A and 5B.

In addition, any uncorrelated noise from the split tail current sources 2A and 2B appears across resistor R together with the thermal noise generated by resistor R. The total input referred noise is then $$\sqrt{4kT\Delta f \left\{ \frac{2}{3} \left[ \frac{g_{m1} + g_{m3} + g_{m2} + g_{m4}}{(g_{mEffrctive})^2} \right] + R \right\} + (i_{noiseTail})^2 R^2}.$$

While this noise is greater than that of the ideal stage 1A of FIG. 1A because $g_{mEffective} < g_{m1,2}$ and $R > 0$ and $I_{noiseTail} > 0$, the new noise sources in FIG. 5 may be kept small without modifying the parameters that significantly decrease the performance of amplifier 20A as occurs in the prior art circuit 1C of FIGS. 1A and 2. When compared to the noise of the prior art circuit 1C of FIGS. 1C and 2, it may be shown that the new noise sources R and $I_{noiseTail}$ are significantly smaller than the noise contributions of $g_{m6}$, $g_{m7}$ and the increased $g_{m3}$ and $g_{m4}$. Additionally, the effective input pair transconductance $g_{mEffective}$ of input transistors M1 and M2 together with offset resistor R never decreases as a function of input offset voltage and therefore never approaches the low values of the prior art circuits of FIG. 1A, 1C or 2. Since the offset voltage is not linked to the $g_m$ of input transistors M1 and M2, the previously mentioned conflicting requirements between $g_m$ and offset range does not exist in the circuit of FIG. 5. The designer may optimize input $g_m$ and offset voltage range nearly independently of each other.

The input offset voltage of the circuit of FIG. 5 is simply the IR voltage drop across offset resistor R, and there are two direct methods of controlling this offset. The first method is suggested by the current balance variable X in the tail current circuits 2A and 2B in FIG. 5. If offset resistor R between the sources of input transistors M1 and M2 is fixed in value and the tail current balance X is varied between 0 and 1, the offset voltage drop across resistor R also varies. The total tail current $I_{tail1}$ remains constant but is divided into two parts, the $X \times I_{tail1}$ portion (where $0 < X < 1$) which flows into the source node 24A of transistor M1 and the remaining $(1-X) \times I_{tail1}$ portion flows into the source node 24B of transistor M2. Since the drain currents of transistors M1 and M2 are equal when the amplifier is operating normally, the difference current $[X-(1-X)] \times I_{tail1}$ flows through offset resistor R. This produces input offset voltage values in the range of $(-R \times I_{tail1})/2$ when $X=0$ to $(+R \times I_{tail1})/2$ when $X=1$. The offset voltage may be programmed to 0 by setting $X=\frac{1}{2}$ to make the IR voltage drop across offset resistor R equal to 0 (because $\{\frac{1}{2}-[1-(\frac{1}{2})]\} \times I_{tail1} = 0 \times I_{tail1} = 0$).

There are three main advantages of this implementation over the segmented input device implementation of FIG. 4. First, it is relatively easy to provide a current DAC 2 that splits $I_{tail1}$ into the controllable current sources 2A and 2B to implement the circuit of FIG. 5. DAC 2 is indicated by a dashed line around programmable current sources 2A and 2B in FIG. 5. Second, since the current through input transistors M1 and M2 does not change, their combined transconductance $g_m$ is constant and does not cause variations in other amplifier parameters that depend on $g_m$, such as gain, bandwidth, etc. Third, the programmed offset voltage is a linear symmetrical function across its full bipolar range since it depends linearly on the current difference and not on nonlinear parameters such as FET overdrive voltage versus geometry ratio Z.

The basic programmable offset amplifier circuits shown in FIGS. 4 and 5 were derived and evaluated, and both provided perform substantially better than the circuit 1C of Prior Art FIGS. 1C and 2. The disadvantage of the implementation in FIG. 5 over the segmented input transistor method of FIG. 4 is that the noise is slightly higher and the input $g_m$ is slightly lower than in amplifier 10 of FIG. 4 even if the programmed input offset voltage in the circuit of FIG. 4 is zero. (Remember that the circuit of FIG. 4 becomes identical to the reference amplifier of FIG. 1A when an equal number of transistor segments are chosen for of input transistors M1 and M2, in which case the circuit of FIG. 4 performs identically with the above mentioned "reference amplifier" of Prior Art FIG. 1A for zero programmed input offset voltage.)

Figure 6:
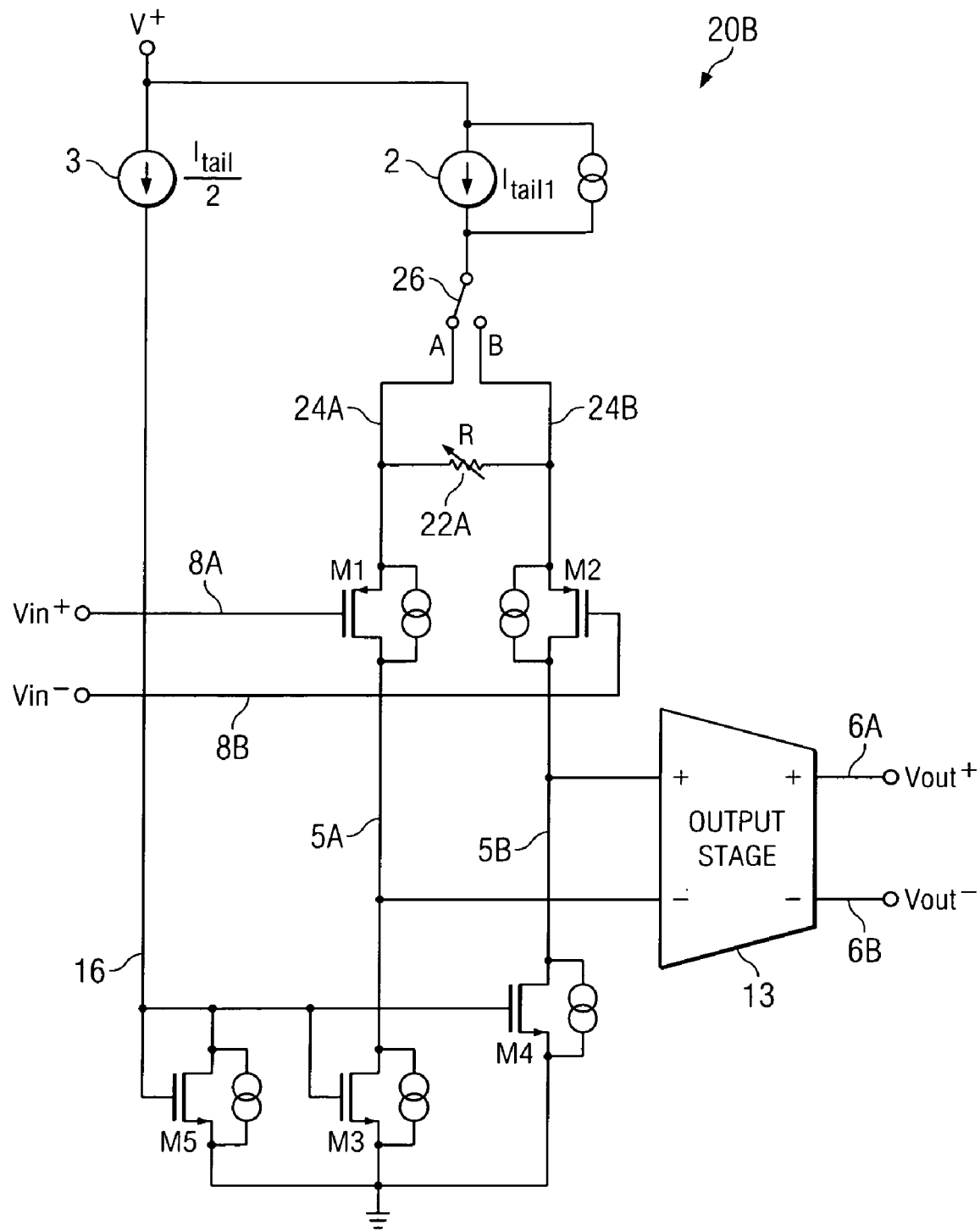
FIG. 6 is a schematic diagram of a variation of the programmable offset amplifier of FIG. 5.

A second method of controlling the input offset voltage with the topology of FIG. 5 is to provide a constant current imbalance and vary the value R of offset resistor 22 instead. Referring to FIG. 6, programmable offset amplifier 20B includes current source 3, input transistors M1 and M2, transistors M3-5, and output stage 13 connected generally as shown in FIG. 5. However, the constant offset resistor R of FIG. 5 is replaced by a variable offset resistor 22A in FIG. 6, which may be implemented by means of fixed resistors and switches that are controlled to connect the switches so as to vary the offset resistance R. Current source 2, which produces a current $I_{tail1}$, is coupled between $V^+$ and the pole terminal of a single pole, double throw switch 26, the A terminal of which is connected to conductor 24A and the B terminal of which is connected to conductor 24B.

In programmable input offset amplifier 20B of FIG. 6, all of the current $I_{tail1}$ is coupled to flow through one or the other of conductors 24A and 24B so as to split the tail current evenly between offset resistor R and the source of the input transistor M1 or M2 which is connected by switch 26 to current source 2. The input offset voltage then has a range of $+/-I_{tail1} \times Rmax/2$, wherein $0 < R < Rmax$. The polarity sign of the offset voltage depends on which side of variable resistor 22A receives the tail current $I_{tail1}$. (Note that if the variable offset resistance R=0, the circuit becomes essentially the same as the ideal reference amplifier of Prior Art FIG. 1A.) The main advantage of the implementation of FIG. 6 is that there is no performance degradation at zero (or low) programmed offset voltages compared with the corresponding performance degradation in the implementation of FIG. 5. The performance of the two methods is identical at the maximum offset voltage.

There are three disadvantages of implementation shown in FIG. 6 over the implementation shown in FIG. 5. First, the effective $g_m$ of the input stage does vary some with the change in variable offset resistance R, although it varies much less than in the prior art circuit 1C of FIG. 1C. Second, it is more difficult to implement a variable floating offset resistance R with fine granularity than it is to implement a current steering DAC. Third, switching of $I_{tail1}$ from one side of offset resistor 22A to the other is still required in order to implement a bipolar input offset. Therefore, both a variable resistor and what may be viewed as a simple current DAC are required to implement the circuit of FIG. 6.

Figure 7:
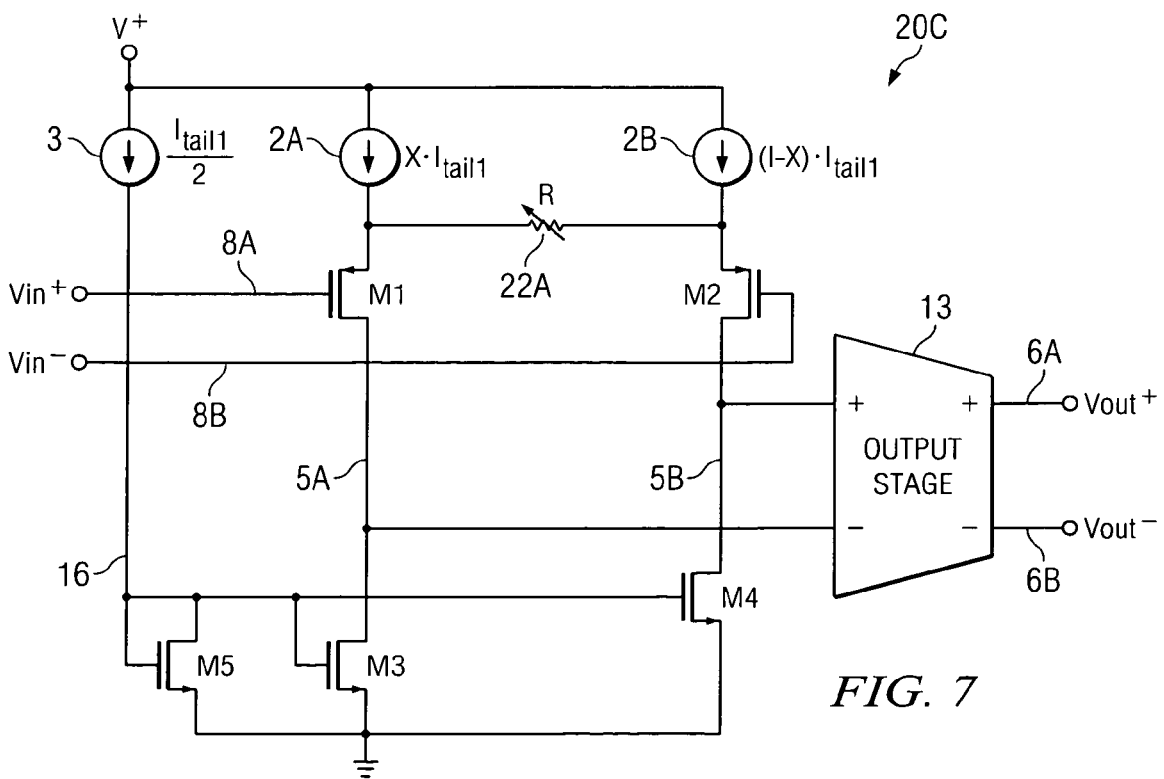
FIG. 7 is a schematic diagram of another variation of the programmable offset amplifier of FIG. 5.

A combination of the two above mentioned methods is also possible wherein a current DAC for producing the two tail current portions $X \times I_{tail1}$ and $(1-X) \times I_{tail1}$ is combined with multiple resistance values R of the offset resistor to provide the advantages of both approaches, as shown in FIG. 7.

In FIG. 7, programmable offset amplifier 20C includes the same current sources 2A, 2B and 3, input transistors M1 and M2, transistors M3-5, and output stage 13 connected generally as in FIG. 5. However, offset resistor 22 in FIG. 5 is replaced by variable offset resistor 22A in FIG. 7.

While it has been shown that the programmable offset stage 20C of FIG. 7 provides superior noise performance to the prior art auto-zero circuit of FIG. 2, there nevertheless are reasons for adding auto-zero functionality to it. For example, the circuit of FIG. 7 suffers from unintended transistor mismatch errors that can produce undesirable offset components and thermal drift. The offset generating circuitry, including subsequently referred to "input elements", may introduce additional non-ideal behavior (beyond that found in the reference amplifier stage 1A of FIG. 1A) which creates undesired drift and unintended offset variations in the amplifier.

As discussed previously, the auto-zero circuit of Prior Part FIG. 1B excels at removing small mismatch, temperature and process-influenced offset voltages from an ideal amplifier. The auto-zeroing technique may equally well be applied to the amplifiers of FIGS. 4 through 7 to provide the same benefits.

Since the auto-zero circuitry was shown to be problematic in the prior art amplifier 1B of FIG. 1B, it might be expected to be problematic when added to the programmable input offset amplifier of FIG. 7. However, it should be understood that the problems exhibited by the prior art auto-zero circuit of FIG. 1B resulted from pushing the auto-zero circuitry operation beyond its useful range of correcting small mismatch and drift errors and into an inappropriate range of producing much larger programmed offset voltages. In contrast, the circuits of FIGS. 4 through 7 develop the large programmed input offset voltages by a completely different means that does not even include auto-zero circuitry. Only small mismatch and drift errors need to be corrected in these amplifiers, just as in the simple reference amplifier of FIG. 1A. Therefore, auto-zero techniques may applied to the amplifiers of FIGS. 4-7 as successfully as they are in the auto-zero amplifier of FIG. 1B without degrading performance, since the auto-zero circuitry when used in the circuits of FIGS. 4-7 still would operate to correct small errors only.

Figure 8:
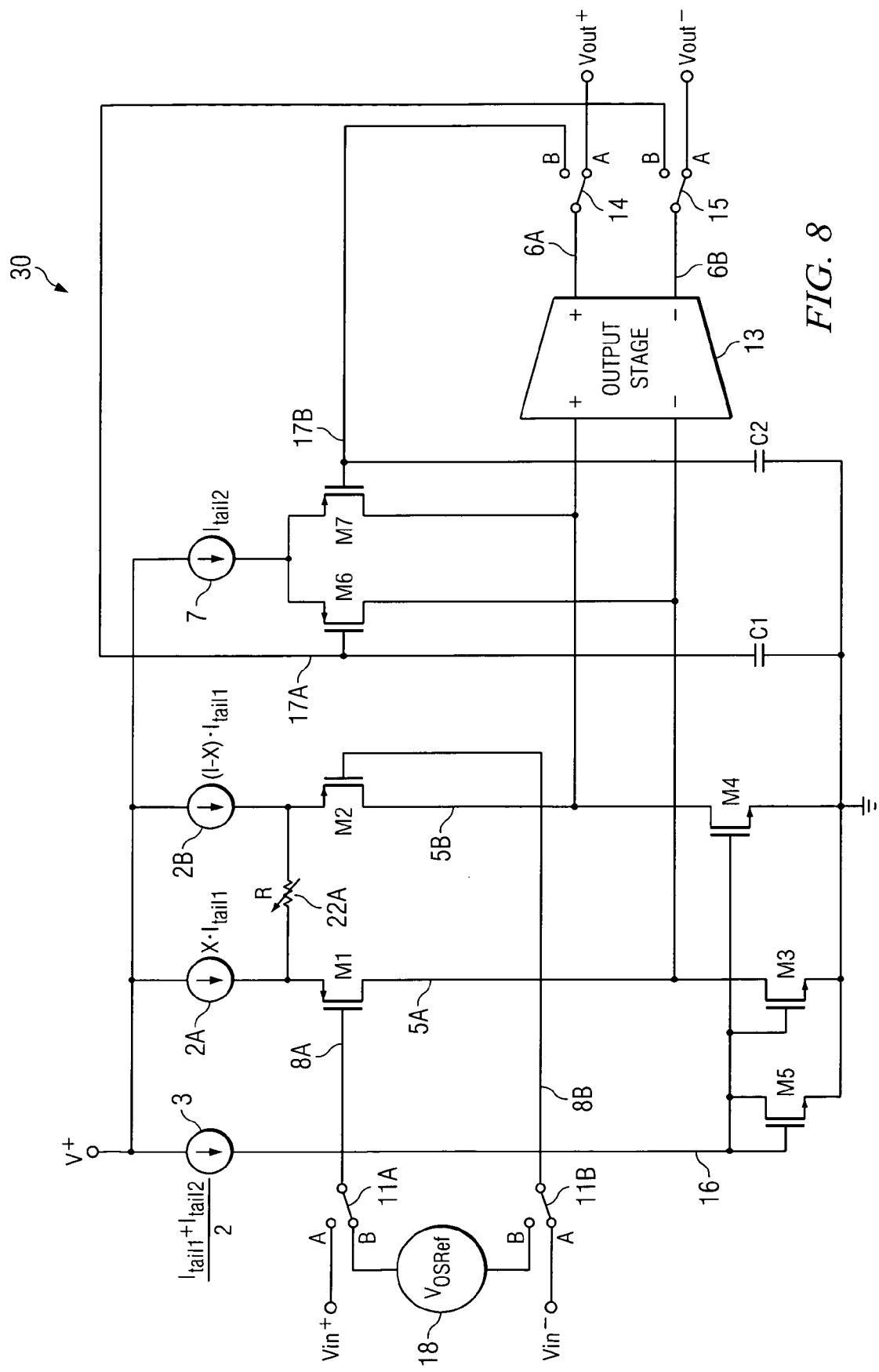
FIG. 8 is a schematic diagram of a presently preferred embodiment of the invention which is a variation of the programmable offset amplifier of FIG. 7.

FIG. 8 shows the circuit of FIG. 7 with a precision offset reference 18 and the auto-zero circuitry of Prior Art FIG. 1C added. In FIG. 8, programmed input offset amplifier 30 includes all of the circuitry shown in FIG. 7, and further includes the auto-zero circuitry including switches 11A, 11B, 14, and 15 connected as in Prior Art FIG. 1C and also includes current source 7, transistors M6 and M7, and capacitors C1 and C2 connected as shown in Prior Art FIG. 1C. In FIG. 8, current source 3 produces the current $(I_{tail1}+I_{tail2})/2$, as in Prior Art FIG. 1C. A programmable input offset reference voltage circuit 18 produces a programmable offset reference voltage $V_{OSRef}$ between conductors 8A and 8B.

In FIG. 8, the general approach shown in FIG. 7 is combined with conventional auto-zero circuitry to provide the programmable offset amplifier 30 to achieve the best performance across a wide input range with fine control over the programmed offset voltage. The problem of providing fine granularity in a variable floating offset resistance R is alleviated by using this approach because most of the control is performed in an $I_{tail}$ current DAC 2 as shown in FIG. 5 while only a few values of offset resistance R are required to improve performance.

Even finer granularity is obtained by providing the auto-zero circuitry and the programmable offset reference voltage source 18. The programmable offset reference voltage $V_{OSRef}$ produced by voltage source 18 allows glitch-free operation, while the auto-zero circuitry removes small errors and drifts. In addition, the auto-zero circuit relieves some of the requirements on the resolution of the tail current DAC since small differences between the offset reference voltage $V_{OSRef}$ and the offset voltage values across offset resistor 22A may be corrected by the auto-zero circuit as though they were mismatch errors. Therefore, fine resolution in setting the programmed input offset voltage may be achieved using offset reference voltage $V_{OSRef}$ and the auto-zero circuitry even without the need for a high resolution tail current DAC.

As long as the auto-zero circuit is not required to provide large offset voltages, it does not contribute appreciably to noise or other problems. The added auto-zero circuitry is only needed to provide offset cancellation for small mismatch errors and small differences between programmed offset values and the offset reference voltage $V_{OSRef}$, and therefore may be sized and biased in the same way as is the prior art auto-zero circuit of FIG. 1B.

Thus, the programmable offset amplifier circuit 30 of FIG. 8 allows the designer freedom to optimize the amplifier circuitry for good performance independently of the programmed input offset range. At zero programmed offset voltage (with offset resistance R=0), the circuit performs as well as the prior art auto-zero amplifier of FIG. 1B. At large values of programmed offset, the circuit performance degrades only due to the addition of noise components from the offset resistor 22A and the split tail current sources 2A and 2B. The circuit does not suffer the previously described performance problems of widely varying input $g_m$ values and all of its attendant problems. Additionally, an external precision offset voltage reference may be used with the circuit of FIG. 8, allowing it to be used in a low glitch multi-amplifier arrangement.

In programmable input offset amplifier 30 of FIG. 8, a programmable internal coarse offset voltage (e.g., +/−50 to +/−100 millivolts) is generated using the programmable offset circuitry shown in FIGS. 4-7. It is difficult to provide that offset voltage with a very high level of precision. Therefore, the coarse internal offset voltage across offset resistor R is precisely calibrated (e.g., to within about 1 microvolt) to the "external" programmable offset reference voltage $V_{OSRef}$ which is generated by offset reference voltage source 18. Then the auto-zero circuitry shown in FIG. 8 operates to eliminate any difference between the offset reference voltage $V_{OSRef}$ and the coarse internal offset voltage previously programmed into the subsequently defined "input elements" in the front end of the amplifier circuitry by means of the programmable tail currents and/or the offset resistor or the programmable input transistor segments.

The providing of programmable offset reference voltage $V_{OSRef}$ needs to be "coordinated" with the operation of the programmable coarse internal input offset voltage generating circuitry. For example, in an embodiment of the invention wherein four programmable input offset amplifiers 30 of FIG. 8 are included on a single integrated circuit chip, they all are programmed to generate the same internal input offset voltage and the four programmable input offset amplifiers would need to be sequentially calibrated to $V_{OSRef}$.

In FIG. 4 the internal input offset voltage is set by programming the current densities in input transistors M1 and M2. This is accomplished by programming the number of transistor segments, and hence the size, of each input transistor. However, in FIGS. 5-8 the internal input offset voltage is set by programming the voltage drop across the offset resistor R. This can be accomplished by programming the portions of the total tail current $I_{tail1}$ which flow through offset resistor R and/or programming the resistance R of the offset resistor.

In both cases, the total tail current or bias current $I_{tail1}$ of the input transistor pair M1,M2 is directed through "input elements", wherein the offset resistor R and the input transistor pair M1,M2 are input elements. The input elements, which may include the fractional balancing portions X and (1−X) of $I_{tail1}$, also may be programmable. In each case, the programmability of one or more of the input elements, including the portions of the tail current $I_{tail1}$, results in corresponding changes in the input offset voltage of the amplifier. In both cases, the input offset voltage is the differential voltage that is required to be applied at the amplifier input (i.e., Vin$^+$ and Vin$^-$) that causes equal current ($I_{tail1}/2$) to flow in input transistors M1 and M2.

Some applications of the present invention require multiple programmable input offset amplifiers to provide precisely matching programmed offset voltages. However, any mismatch in the programmed input offset voltages of the multiple amplifiers results in signal glitches when switching between their respective input stages. For example, an application of the programmable input offset voltage amplifier of FIG. 8 is to provide four of them in a single package, wherein the input offset voltages of all four amplifiers need to be precisely the same, for example to within 1 microvolt. Due to slight mismatches between various transistors in the four amplifiers, it is very difficult to precisely match the identically programmed input offset voltages of the four amplifiers to within 1 microvolts. However, a single programmed reference $V_{OSRef}$ can be used to calibrate multiple amplifiers, as is alluded to in the assignee's pending patent application Ser. No. 11/890,204, filed Aug. 3, 2007, entitled "LOW GLITCH OFFSET CORRECTION CIRCUIT FOR AUTO-ZERO SENSOR AMPLIFIERS AND METHOD", by the present inventors, and incorporated herein by reference.

In amplifier stage 30 of FIG. 8, $V_{OSRef}$ may be set to any value within a range (e.g. +/−100 millivolts) with any precision desired and then the offset of the amplifier is programmed by digital switching and control circuitry (not shown) to the value that it is capable of producing and which comes closest to matching $V_{OSRef}$. The auto-zero circuitry then makes up the difference between $V_{OSRef}$ and the foregoing nearest programmed offset value and forces the input offset voltage of the amplifier to perfectly match $V_{OSRef}$. For example, the digital control circuitry can use 8 bits for setting $V_{OSRef}$ but only 6 bits for setting values of $I_{tail1}$ in a current DAC implementation of the tail current source. The least significant 2 bits can be effectively set by the auto-zero circuitry as though they represent mismatch error or some other error. The foregoing technique provides the precision needed for non-glitch operation of the programmable input offset amplifier stage 30 of FIG. 8 by perfectly matching $V_{OSRef}$ in the multiple front end stages of integrated circuit chip 50 of subsequently described FIG. 9 without having to provide a precise current DAC in each of the multiple front end stages 30-1,2,3,4 included on chip 50, which is an embodiment of the invention provided in the assignee's recently introduced and marketed PGA308 product.

Figure 9:
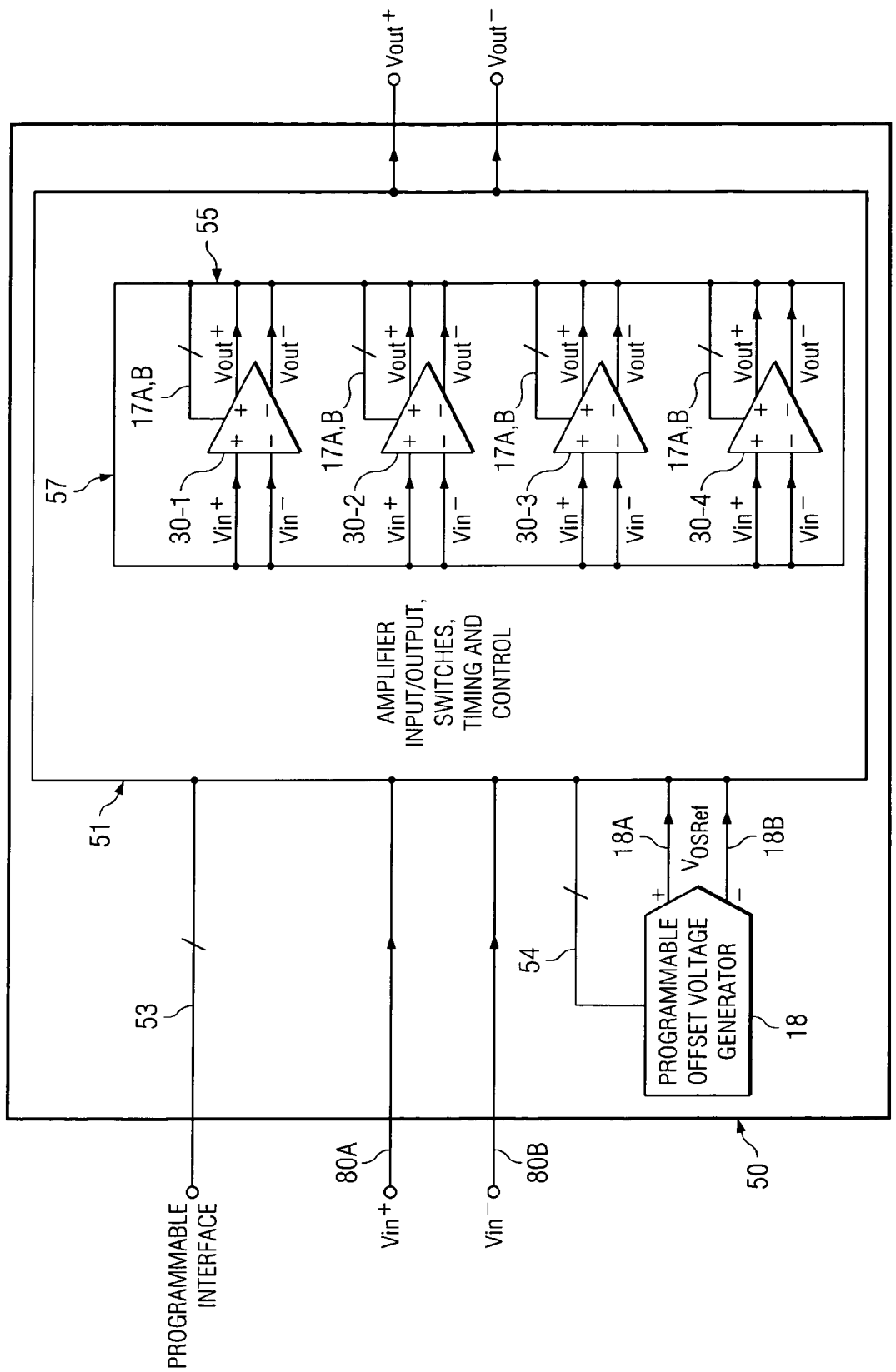
FIG. 9 is a diagram of an integrated circuit chip including a plurality of the programmable input offset voltage amplifiers generally shown in FIG. 8 along with a single programmable input offset reference voltage circuit.

Referring to FIG. 9, integrated circuit chip 50 includes four programmable input offset amplifiers 30-1, 30-2, 30-3, and 30-4 which sequentially share a single programmable offset voltage generator 18. Each of programmable input offset amplifiers 30-1, 30-2, 30-3, and 30-4 is substantially the same as programmable input offset amplifier 30 shown in FIG. 8, but excluding $V_{OSRef}$ generator 18 and switches 11A, 11B, 14, and 15. For simplicity, input offset amplifiers 30-1, 30-2, 30-3, and 30-4 are illustrated as being included in a block 57 which itself is included in a larger block 51 that also includes Amplifier Input/Output, Switching, Timing & Control circuitry. Each conductor in block 57 is connected to appropriate amplifier input/output, switches, and timing & control circuitry in block 51. The outputs of each of amplifiers 30-1,2, 3,4 are fed back to timing and control circuitry in block 51 in order to make the auto-zero circuitry associated with each of amplifiers 30-1,2,3,4 operate properly, and also are fed forward to amplifier output switch and control circuitry included in block 51. Amplifier Input/Output, Switching, Timing & Control circuitry in block 51 operates to (1) selectively couple a differential input signal Vin$^+$–Vin$^-$ between the (+) and (−) inputs of one of the four input offset amplifiers 30-1, 30-2, 30-3, and 30-4 in response to Programmable Interface information on digital bus 53, (2) selectively couple input offset programming information to variable current sources 2A and 2B and programmable offset resistor 22A in FIG. 8 and control auto-zero switches included in block 51, (3) selectively couple $V_{OSRef}$ programming information to programmable offset voltage generator 18 in FIG. 9 by means of timing and control information generator in block 51 and applied via digital bus 54 to the inputs of program and also generator 18, and (4) selectively couple the differential output signal between the (+) and (−) outputs of the output stage 13 of the selected input offset amplifier 30-1, 30-2, 30-3, or 30-4 to the Vout$^+$ and Vout$^-$ terminals in FIG. 9. Due to the complexity of wiring required to show all of the connections to the various auto-zero switches and the various amplifier circuitry inputs and outputs, these details have been omitted from FIG. 9 but are very straightforward, and are provided in the assignee's recently introduced and commercially available PGA308, and can be readily provided by those skilled in the art.

Figure 3:
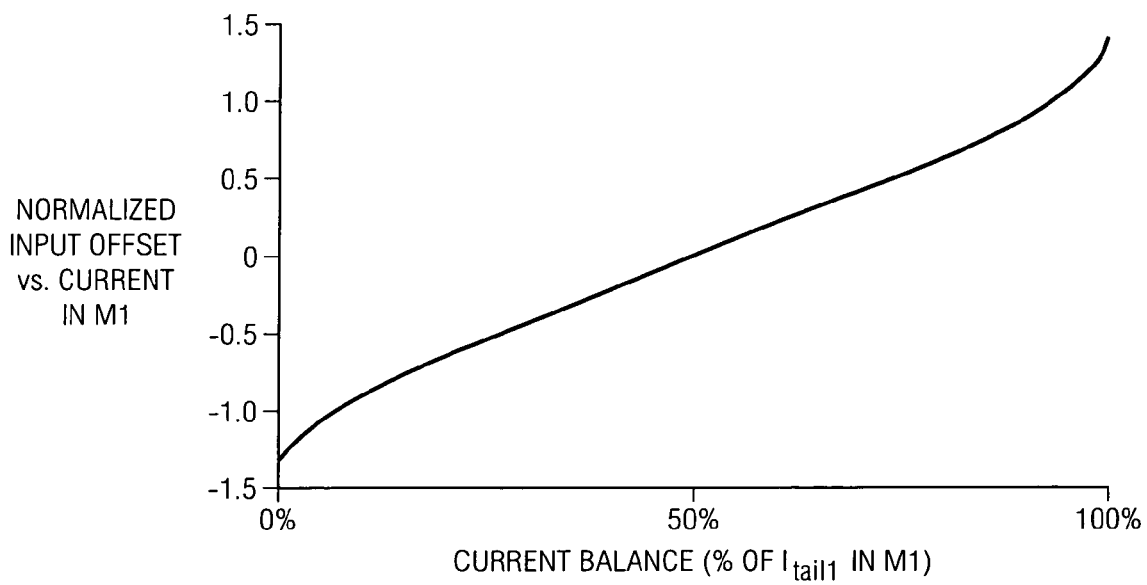
FIG. 3 is a graph showing input offset voltage as a function of the current balance between transistors M1 and M2 in FIG. 2.

Note that FIG. 3 of above incorporated-by-reference application Ser. No. 11/890,204 shows a practical implementation of programmable $V_{OSRef}$ generator 18 and associated auto-zero switches which could be used if the circuitry shown in FIG. 8, excluding $V_{OSRef}$ generator 18 and switches 11A, 11B, 14, and 15, is used to replace each of the "AZ Stages" A, B, C and D in FIG. 3 of Ser. No. 11/890,204. This same circuitry can be utilized in FIG. 9.

Thus, logic circuitry is provided in block 51 of integrated circuit chip 50 to ensure that the programmable internal input offset voltage generating circuitry 18 is programmed to generate a value of the internal input offset voltage which is very close to the value of $V_{OSRef}$ which programmable external reference voltage circuit 18 is programmed to generate. The logic circuitry operates to compare the present programmed value of $V_{OSRef}$, one at a time, to the internal input offset voltages previously programmed into the four programmable input offset voltage amplifiers on the chip. Therefore, the operation of the auto-zero circuitry needs to eliminate only the small error voltages between the single value of $V_{OSRef}$ and the four values of the of the internal input offset voltages of the four amplifiers on the same chip to thereby eliminate any small errors due to internal component mismatches. This avoids the previously described performance problems that result if auto-zero circuitry is used to eliminate large offset voltages.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, although the current mirror output transistors M3 and M4 are shown as load devices, in some cases resistors could be used instead.

As another example, although the described embodiments use field effect transistors, bipolar transistors may be used instead of field effect transistors. Furthermore, transistors of one conductivity type (e.g., NPN or N-channel transistors) may also be used as input transistors and transistors of the opposite conductivity type (e.g., PNP or P-N-channel transistors) may be used as load devices. Also, it would be possible to use a resistive element other than a fixed resistor to produce the offset voltage between the sources of input transistors M1 and M2 in FIGS. 5-8. For example, a field effect transistor could be used, or in some cases a diode could be used. Accordingly, the term "offset resistor" or "offset resistance" as used herein is intended to encompass an offset resistance developed across any of the foregoing resistive devices or a diode. Also, it should be appreciated that if no auto-zero circuitry is utilized, a separate output stage 13 might possibly be omitted, in which case the output stage could be considered to be part of the main stage including input transistors M1 and M2 and load transistors M3 and M4, along with any needed buffering transistors such as source follower transistors having gates connected to conductors 5A and 5B.

What is claimed is:

1. Programmable input offset voltage amplifier circuitry, comprising:
   first and second input transistors having first electrodes and having control electrodes coupled to first and second input voltages;
   first and second load devices coupled between a reference voltage and second electrodes of the first and second input transistors, respectively;
   programmable input offset circuitry including input elements, wherein the programmable input offset circuitry directs a first tail current to be shared between the first and second input transistors, and wherein the programmable input offset circuitry produces programmable internal voltage changes across the input elements so as to produce corresponding changes in voltages of at least one of the first and second input transistors to cause the internal voltage changes to be reflected back to a differential input voltage applied between the control electrodes of the first and second input transistors; and
   an output stage having a first input coupled to the second electrode of the second input transistor and a second input coupled to the second electrode of the first input transistor.

2. The programmable offset voltage amplifier circuitry of claim 1 wherein the transistors are field effect transistors and wherein the first electrodes are sources, the second electrodes are drains, and the control electrodes are gates.

3. The programmable offset voltage amplifier circuitry of claim 2 wherein the first and second load devices include first and second current mirror output transistors, respectively, the programmable input offset amplifier circuitry including a current mirror input transistor having a gate and a drain coupled to a first current source and gates of the first and second current mirror output transistors.

4. The programmable offset voltage amplifier circuitry of claim 2 wherein the programmable input offset circuitry includes a plurality of programmable input transistor segments and associated switches from which the first and second input transistors are formed so as to balance portions of the first tail current flowing through the first and second input transistors, respectively.

5. The programmable offset voltage amplifier circuitry of claim 2 wherein the programmable input offset circuitry includes an offset resistor coupled between the sources of the first and second input transistors.

6. The programmable offset voltage circuitry of claim 5 wherein the programmable input offset circuitry includes a first programmable current source producing a first programmable portion of the first tail current coupled to the source of the first input transistor, a second programmable current source producing a second programmable portion of the first tail current coupled to the source of the second input transistor.

7. The programmable offset voltage circuitry of claim 5 wherein the programmable input offset circuitry includes a switch having a pole terminal coupled to receive the first tail current, a first terminal coupled to the source of the first input transistor and a second terminal coupled to the source of the second input transistor.

8. The programmable offset voltage amplifier circuitry of claim 2 wherein the programmable input offset circuitry includes a programmable offset resistance.

9. The programmable offset voltage amplifier circuitry of claim 2 wherein the programmable input offset circuitry includes a programmable offset resistor coupled between the sources of the first and second input transistors, a first programmable current source producing a first programmable portion of the first tail current coupled to the source of the first input transistor, and a second programmable current source producing a second programmable portion of the first tail current coupled to the source of the second input transistor.

10. The programmable offset voltage amplifier circuitry of claim 6 wherein the first programmable current source and the second programmable current source are implemented by means of a current digital to analog converter (DAC).

11. The programmable offset voltage amplifier circuitry of claim 2 including first auto-zero circuitry coupled between the first and second input voltages and the gates of the first and second input transistors, respectively, and also including second auto-zero circuitry coupled to first and second outputs of the output stage.

12. The programmable offset voltage amplifier circuitry of claim 9 including a programmable offset reference voltage source for being controllably coupled between the gates of the first and second input transistors to produce a programmable offset reference voltage between the gates of the first and second input transistors, and also including first auto-zero circuitry coupled between the first and second input voltages and the gates of the first and second input transistors, respectively, and also including second auto-zero circuitry coupled to first and second outputs of the output stage.

13. The programmable offset voltage amplifier circuitry of claim 12 wherein the first auto-zero circuitry includes a first switch having a pole terminal coupled to the gate of the first input transistor and a second switch having a pole terminal coupled to the gate of the second input transistor, the first switch having a first terminal coupled to the first input voltage, the second switch having a first terminal coupled to the second input voltage, the first switch having a second terminal coupled to a first terminal of the programmable offset reference voltage source, the second switch having a second terminal coupled to a second terminal of the programmable offset reference voltage source, and wherein the second auto-zero circuitry includes a third switch having a pole terminal coupled to a first output of the output stage and a fourth switch having a pole terminal coupled to a second output of the output stage, the third switch having a first terminal coupled to a first output voltage of the programmable offset voltage amplifier circuitry, the fourth switch having a first terminal coupled to a second output voltage of the programmable offset voltage amplifier circuitry, the third switch having a second terminal coupled to a gate of a first transistor and a terminal of a first capacitor having another terminal coupled to the reference voltage, the fourth switch having a second terminal coupled to a gate of a second transistor and a terminal of a second capacitor having another terminal coupled to the reference voltage, drains of the first and second transistors being coupled to drains of the second and first transistors, respectively, sources of the first and second transistors being coupled to receive a second tail current.

14. An apparatus comprising:
a first transistor having a first electrode, a second electrode, and a control electrode, wherein the control electrode of the first transistor receives a first input voltage;
a second transistor having a first electrode, a second electrode, and a control electrode, wherein the control electrode of the second transistor receives a second input voltage;
a first current source;
a current mirror that is coupled to the first current source, the second electrode of the first transistor, and the second electrode of the second transistor;
programmable offset circuitry having a second current source, wherein the programmable offset circuitry is coupled to the first electrode of the first transistor and the first electrode of the second transistor, and wherein the first current source shares a first tail current across first and second input transistors as directed by programmable input offset circuitry; and
an output stage that is coupled to the second electrode of the first transistor and the second control electrode of the second transistor.

15. The apparatus of claim 14, wherein the current mirror further comprises:

a first current mirror transistor, wherein the first current mirror transistor is diode-connected and is coupled to the first current source at its control electrode;
a second current mirror transistor that is coupled to the control electrode of the first current mirror transistor at its control electrode and that is coupled to the second electrode of the first transistor at its first electrode; and
a third current mirror transistor that is coupled to the control electrode of the first current mirror transistor at its control electrode and that is coupled to the second electrode of the second transistor at its first electrode.

16. The apparatus of claim 15, wherein the first transistor further comprises a plurality of first transistors, wherein each first transistor is coupled to the second current source at its first electrode, and wherein the second transistor further comprises a plurality of second transistors, and wherein each second transistor is coupled to the second current source at its first electrode.

17. The apparatus of claim 16, wherein the programmable offset circuitry further comprises:
a first set of switches, wherein each switch from the first set of switches is coupled to the control electrode of at least one of the first and second transistors; and
a second set of switches, wherein each switch from the second set of switches is coupled to the output stage and to the second electrode of at least one of the first and second transistors.

18. The apparatus of claim 15, wherein the programmable offset circuitry further comprises a resistor that is coupled between the first electrodes of the first and second transistors.

19. The apparatus of claim 18, wherein the second current source further comprises a current DAC that is coupled to the first electrodes of the first and second transistors.

20. The apparatus of claim 18, wherein the resistor further comprises a variable resistor.

21. The apparatus of claim 20, wherein the second current source further comprises:
a first variable current source that is coupled to the first electrode of the first transistor; and
a second variable current source that is coupled the first electrode of the second transistor.

22. The apparatus of claim 21, wherein the programmable offset circuitry further comprises:
a voltage source;
a first input switch that is coupled to the control electrode of the first transistor, that is coupled to the voltage source, and that receives the first input voltage;
a second input switch that is coupled to the control electrode of the second transistor, that is coupled to the voltage source, and that receives the second input voltage.

23. The apparatus of claim 22, wherein the apparatus further comprises auto-zeroing circuitry that is coupled to the output stage.

24. The apparatus of claim 20, wherein the programmable offset circuitry further comprises a switch that is coupled to the second current source, the first electrode of the first transistor, and the first electrode of the second transistor.

* * * * *